United States Patent [19]

Kempf

[11] Patent Number: 4,859,551

[45] Date of Patent: Aug. 22, 1989

[54] PROCESS FOR PREPARING POSITIVE AND NEGATIVE IMAGES USING PHOTOHARDENABLE ELECTROSTATIC MASTER

[75] Inventor: Richard J. Kempf, Towanda, Pa.

[73] Assignee: E. I. Du Pont de Nemours and Company, Wilmington, Del.

[21] Appl. No.: 116,656

[22] Filed: Nov. 4, 1987

[51] Int. Cl.⁴ ........................ G03F 7/20; G03G 13/32

[52] U.S. Cl. ...................................... 430/49; 430/291; 430/306; 430/309

[58] Field of Search ............. 430/286, 910, 301, 115 P

[56] References Cited

U.S. PATENT DOCUMENTS

| | | | |
|---|---|---|---|
| 4,029,505 | 6/1977 | Nebe | 96/35.1 |
| 4,149,798 | 4/1979 | McGowan | 430/49 |
| 4,162,162 | 7/1979 | Dueber | 96/115 P |
| 4,198,242 | 4/1980 | Pazos | 430/286 |
| 4,269,933 | 5/1981 | Pazos | 430/291 |
| 4,275,140 | 6/1981 | Neiss | 430/254 |
| 4,595,651 | 6/1986 | Grossa | 430/394 |

*Primary Examiner*—John L. Goodrow

[57] ABSTRACT

Process for producing negative or positive images from a photohardenable electrostatic master comprising an electrically conductive substrate bearing a photohardenable layer containing a photoinhibitor and a visible light sensitizer wherein the negative image (1) is prepared by (a) imagewise exposing to visible radiation, (b) charging electrostatically the master, (c) developing the charged image with an electrostatic toner, e.g., liquid electrostatic developer, and (d) transferring the toner image to a surface, e.g., paper. The positive image (2) is prepared by (a) imagewise exposing to ultraviolet radiation. (b) exposing overall to visible radiation followed by steps (b), (c) and (d) above. Multiple images can be prepared from the same master as well as color proofs using different color toners or developers and transferring in register over the original image.

50 Claims, 1 Drawing Sheet

PROCESS FOR PREPARING POSITIVE AND NEGATIVE IMAGES USING PHOTOHARDENABLE ELECTROSTATIC MASTER

TECHNICAL FIELD

This invention relates to an electrostatic process for producing images using a photohardenable electrostatic master. More particularly this invention relates to an electrostatic process for producing multiple positive or negative images using a photohardenable electrostatic master comprising an electrically conductive support bearing a photohardenable composition comprising a polymeric binder, ethylenically unsaturated compound photoinitiator, photoinhibitor and a sensitizer compound.

BACKGROUND OF THE INVENTION

Photopolymerizable (photohardenable) compositions and films containing binder, monomer, initiator and chain transfer agent are described in the prior art and sold commercially. One important application of photopolymerizable layers is in graphic arts. Photopolymerizable layers on conductive supports currently may be used as electrostatic masters for analog color proofing and are considered as promising future materials to be developed for digital color proofing applications. For the analog color proofing application, a photopolymer layer is coated on an electrically conductive substrate and contact exposed with an ultraviolet (UV) source through a half tone color separation negative. The photopolymer hardens in the areas exposed with an ultraviolet source due to polymerization and remains in a softer state elsewhere. The differences in viscosity between the exposed and unexposed areas are apparent in the transport properties, i.e., the unexposed photopolymer conducts more electrostatic charge while the UV exposed areas are substantially nonconductive. By subjecting the exposed photopolymer layer to a corona discharge a latent electrostatic image is obtained consisting of electostatic charge remaining only in the nonconducting or exposed areas of the photopolymer layer. This latent image can then be developed by application of a liquid electrostatic toner to the surface. When the developer has the opposite charge as the corona charge, the developer selectively adheres to the exposed or polymerized areas of the photopolymer layer. The developer in the exposed areas subsequently can be transferred to a surface such as paper to produce an image. The photohardenable electrostatic master described is negative working. Color proofs can be prepared by repeating the procedure using other photopolymer masters, imagewise exposing each master through a different color transparency, corona charging, developing each exposed master with a correspondingly colored developer, and transferring each developed image sequentially in register on the preceding transferred image.

Dueber U.S. Pat. No. 4,162,162 describes certain photopolymerizable compositions which in addition to the basic constituents for a photohardenable composition contain a visible sensitizer and a photoinhibitor. Such a composition is used primarily for preparation of lithographic printing plates. Dueber does also disclose the preparation of colored images from color separation negatives suitable for color-proofing. The Dueber invention is directed to photopolymerizable compositions which are developed by conventional means and not by an electrostatic process. Although various photopolymerizable compositions are disclosed by other inventors to be useful in electrophotography, photopolymer electrostatic masters capable of duplicating the image characteristics of a printing press are only now being developed. It is desirable to provide positive or negative images from a single photopolymer electrostatic master since such a master will satisfy the proofing needs of all printers whether they use negative or positive color separations.

It has now been found that negative or positive images can be provided which are substantially duplicates of a printing press by exposure means described more fully below utilizing a photohardenable electrostatic master having a layer containing a polymer binder, ethylenically unsaturated compound, photoinitiator, photoinhibitor and at least one visible light sensitizer.

SUMMARY OF THE INVENTION

Figure 1:
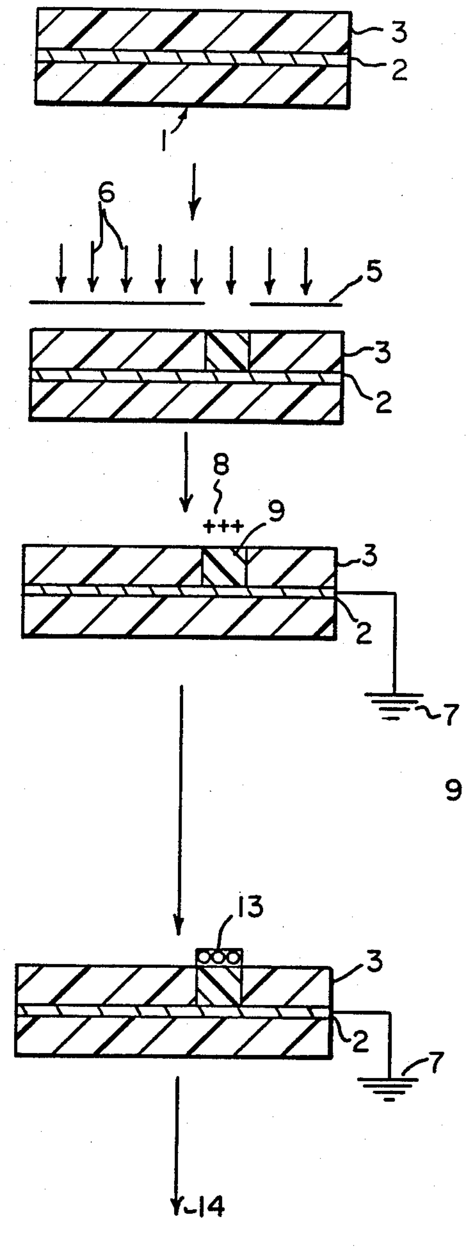
FIG. 1 illustrates a schematic flow chart of the basic process steps for forming a negative image from a photohardenable electrostatic master.

In accordance with this invention there is provided a process for producing a negative image from a photohardenable electrostatic master comprising (A) imagewise exposing to visible radiation a photohardenable electrostatic master comprising (1) an electrically conductive substrate bearing (2) a photohardenable layer comprising (a) a polymeric binder,
(b) a compound having at least one ethylenically unsaturated group,
(c) a photoinitiator,
(d) a photoinhibitor, and
(e) at least one visible light sensitizer;

(B) charging electrostatically the photohardenable electrostatic master to form a latent image of electrostatic charge on the imagewise exposed areas;

(C) developing the charged latent image by applying an electrostatic toner of opposite charge; and (D) transferring the toned image to a receptor surface.

In accordance with this invention there is also provided a process for producing a positive image from a photohardenable electrostatic master comprising (A) imagewise exposing to ultraviolet radiation a photohardenable electrostatic master comprising (1) an electrically conductive substrate bearing (2) a photohardenable layer comprising (a) a polymeric binder,
(b) a compound having at least one ethylenically unsaturated group,
(c) a photoinitiator,
(d) a photoinhibitor, and
(e) at least one visible light sensitizer;

(B) exposing overall the photohardenable electrostatic master to visible radiation;

(C) charging electrostatically the photohardenable electrostatic master to form a latent image of electrostatic charge on the imagewise exposed areas;

(D) developing the charged latent image by applying an electrostatic toner of opposite charge; and (E) transferring the toned image to a receptor surface.

DETAILED DESCRIPTION OF THE INVENTION

The formation of the negative or positive images and color proofs is made possible by use of a photohardenable (photopolymerizable) electrostatic master which bears on the electrically conductive support a photohardenable layer comprising an organic polymeric binder, a compound having at least one ethylenically unsaturated group which can be a monomer, a photoinitiator, a photoinhibitor, and at least one visible light sensitizer. Preferably a chain transfer agent is also present. Other ingredients can also be present as set out below. Polymeric binders, ethylenically unsaturated compounds, photoinitiators, including preferred hexaarylbiimidazole compounds (HABI's) and chain transfer agents are disclosed in Chambers U.S. Pat. No. 3,479,185, Baum et al. U.S. Pat. No. 3,652,275, Cescon U.S. Pat. No. 3,784,557, and Dueber U.S. Pat. No. 4,162,162, the disclosures of each of which are incorporated herein by reference.

This invention is based on the discovery that photohardenable layers on conductive supports which comprise, for example, a nitroaromatic compound photoinhibitor and at least one arylylidene aryl ketone sensitizer compound, are capable of producing both positive and negative images depending on the exposure sequence and exposure wavelengths used. The nitroaromatic compound photoinhibitors in which the nitro group is ortho to a hydrogen-bearing alpha-carbon substituent do not significantly retard or inhibit free-radical polymerization in certain photopolymerizable systems, but are photochemically rearranged to nitrosoaromatic inhibitors of free-radical polymerization by exposure to radiation having a wavelength of about 200 to about 400 nm. These nitroaromatic compounds are relatively unaffected by radiation of longer wavelength. On the other hand, certain radiation-sensitive, free-radical initiators absorb radiation of longer wavelength, especially in the presence of added sensitizers, to provide sufficient radicals for polymerization of a polymerizable monomer in the absence of an appreciable concentration of inhibiting nitrosoaromatic species.

The nitroso compounds formed by irradiation of the nitroaromatic compounds described herein with short wavelength radiation interfere with the normal free-radical induced polymerization process. Thus, when using the shorter wavelength region of the spectrum in the presence of a nitroaromatic compound, on subsequent exposure with visible light, which causes cleavage of the biimidazole, an insufficient number of initiating and propagating free radicals are available, and polymerization does not occur. When a composition of this invention is exposed to radiation of wavelength greater than about 400 nm, the nitroaromatic compound is relatively unaffected, and the photoinitiator system operates to produce initiating radicals. These radicals are able to effect chain propagation in the usual way and polymerization occurs.

In the method of making negative images the imagewise visible radiation exposure wavelength ranges from greater than about 400 to about 800 nm, preferably about 400 to 600 nm. In the method of making positive images at least about 80% of the radiation in the imagewise exposure has a wavelength of 200 to about 400 nm, preferably 300 to 380 nm. The overall exposure in preparing positive images is visible radiation having a wavelength ranging from greater than about 400 to about 800 nm, preferably about 400 to 600 nm.

Binders

Suitable binders include: the polymerized methylmethacrylate resins including copolymers thereof, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g., butadiene/acrylonitrile copolymers and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene. Preferred binders are poly(styrene/methylmethacrylate) and polymethylmethacrylate.

The resistivity of the binder largely contributes to the total resistivity of the photohardenable composition in both exposed and unexposed areas. However, it is the resistivity of the photopolymer matrix or total composition that controls image characteristics and dot gain. If the total resistivity of the unexposed composition is too small, the charge will decay too rapidly in the unexposed areas losing the highlight dots. On the other hand, if the resistivity of the photopolymer composition is too high the discharge rate may be too slow, resulting in overtoning solids and plugging of shadow dots. The preferred resistivity of the exposed photopolymer composition, for the present application, is about $10^{14}$ to $10^{16}$ Ω-cm, corresponding to a binder resistivity in the $10^{16}$ to $10^{20}$ Ω-cm range. For different applications a different resistivity for the binder may be desired.

Ethylenically Unsaturated Compounds

Any ethylenically unsaturated photopolymerizable or photocrosslinkable compound identified in the prior patents for use in HABI-initiated systems can be used. The term "monomer" as used herein includes simple monomers as well as polymers, usually of molecular weight below 1500, having crosslinkable ethylenic groups. Preferred monomers are di-, tri- and tetra-acrylates and -methacrylates such as ethylene glycol diacrylate, diethylene glycol diacrylate, triethylene glycol diacrylate, glycerol diacrylate, glycerol triacrylate, ethylene glycol dimethacrylate, 1,2-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, pentaerythritol triacrylate; the bisacrylates and methacrylates of polyethylene glycols of molecular weight 100–500, etc. A particularly preferred monomer is ethoxylated trimethylolpropane triacrylate.

Initiators

Preferred initiators are the HABI photoinitiators, 2,2′4,4′,5,5′-hexaarylbiimidazoles, sometimes called 2,4,5-triarylimidazolyl dimers, which dissociate on exposure to actinic radiation to form the corresponding triarylimidazolyl free radicals. As indicated above, HABI's and use of HABI-initiated photopolymerizable systems for applications other than for electrostatic uses are disclosed in a number of patents. These include: Cescon U.S. Pat. No. 3,784,557; Chambers U.S. Pat.

No. 3,479,185; Chang et al. U.S. Pat. No. 3,549,367; Baum et al. U.S. Pat. No. 3,652,275; Dueber U.S. Pat. No. 4,162,162; Chambers et al. U.S. Pat. No. 4,264,708; and Tanaka et al., U.S. Pat. No. 4,459,349; the disclosures of these patents are incorporated herein by reference. Any 2-o-substituted HABI or mixtures thereof disclosed in the prior patents can be used in this invention unless they absorb strongly in the range of 300 to 400 nm. The HABI's can be represented by the general formula

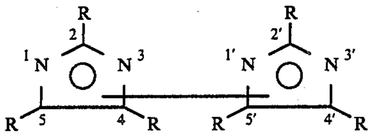

where the R's represent aryl radicals. The 2-o-substituted HABI's are those in which the aryl radicals at positions 2 and 2′ are ortho-substituted. The other positions on the aryl radicals can be unsubstituted or carry any substituent which does not interfere with the dissociation of the HABI upon exposure or adversely affect the electrical or other characteristics of the photopolymer system.

Preferred HABI's are 2-o-chloro substituted hexaphenylbiimidazoles in which the other positions on the phenyl radicals are unsubstituted or substituted with chloro, methyl or methoxy. The most preferred HABI's are 2,2′-bis-(o-chlorophenyl)-4,4′,5,5′-tetrakis(m-methoxyphenyl)-biimidazole and 2,2′-bis(o-chlorophenyl)-4,4′,5,5′-tetraphenylbiimidazole.

Processes for producing HABI compounds result in a mixture of isomers and other impurities. Use of high concentrations of these impure materials can provide photopolymerizable compositions with high sensitivity but poor shelflife or storage stability due to crystallization. It has been found that purification of the materials by various methods can provide relatively pure materials which can be used in high concentration without crystallization.

The HABI's can be purified sufficiently for use in this invention by merely dissolving them in methylene chloride, filtering and recrystallizing by adding methanol or ether. If desired, the solution of the HABI in methylene chloride can be eluted through a silica gel column prior to recrystallization. A preferred method for purification of o-Cl-HABI is as follows:

o-Cl-HABI 225 g of o-Cl-HABI (m.r. 205°-7° C.) is added to 1800 ml methylene chloride and the solution is heated to boiling, 150 g DARCO® G-60 charcoal activated, EM Science, a Division of EM Industries, Inc., Cherry Hill, NJ is then added. The mixture is kept boiling for 30 to 45 min. prior to hot filtration through Celite® Diatomaceous Silica Product, Manville Products Corp., Denver, CO under vacuum. The filtrate is concentrated to yield ca. 135 g (60%) solid with m.r. 203°-5° C. The filter pad is washed with 200 ml of methylene chloride and the filtrate is concentrated to yield ca. 45 g (20%) solid with m.r. 203°-207° C.

Photoinhibitors

Useful photoinhibitors of nitroaromatic compounds are disclosed in Pazos U.S. Pat. No. 4,198,242, the disclosure of which is incorporated herein by reference. Useful compounds of this type are of the formula:

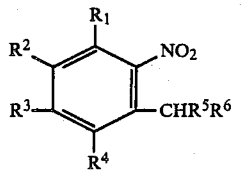

wherein $R^1$, $R^2$, $R^3$ and $R^4$, alike or different are H, OH, halogen, $NO_2$, CN, alkyl of 1 to 18 carbons, alkoxy in which the alkyl is of 1 to 18 carbons, acyloxy of 2 to 7 carbons, aryl of 6 to 18 carbons, benzyl, halogen-substituted phenyl, polyether of 2 to 18 carbons and 2 to 10 oxygens, dialkylamino in which each alkyl is of 1 to 18 carbons, thioalkyl in which the alkyl is of 1 to 18 carbons, or thioaryl in which the aryl is of 6 to 18 carbons, $R^2$ and $R^3$, taken together are $—OCH_2O—$ or $-(O—CH_2CH_2O)_q-$ in which q is an integer from 1 to 5, or any two of $R^1$, $R^2$, $R^3$ and $R^4$, taken together are the residue of a second benzene ring fused into the benzene nucleus, with the proviso that not more than one of $R^1$, $R^2$, $R^3$ and $R^4$ is OH or $NO_2$, $R^5$ is H, alkyl of 1 to 18 carbons, halogen, phenyl, or alkoxy in which the alkyl is of 1 to 18 carbons, $R^6$ is H, OH, alkyl of 1 to 18 carbons, phenyl, alkoxy in which the alkyl is of 1 to 18 carbons, or aryloxy of 6 to 18 carbons unsubstituted or substituted with halogen, alkyl of 1 to 6 carbons, or alkoxy of 1 to 6 carbons, with the proviso that only one of $R^5$ and $R^6$ is H, or $R^5$ and $R^6$ together are $=O$, $=CH_2$, $—O—CH_2—$, $=NC_6H_5$, $=NC_6H_4N(alkyl)_2$ in which each alkyl is of 1 to 18 carbons, $—O—C_2H_4—O—$, $=N(alkyl)$ in which the alkyl is of 1 to 6 carbons,

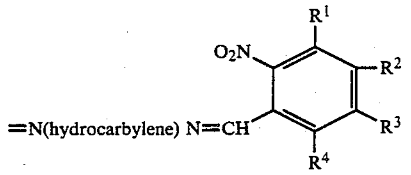

in which the hydrocarbylene group is of 1 to 18 carbons, or

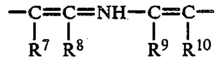

in which $R^8$ and $R^9$, alike or different, are H or alkyl of 1 to 4 carbons, and $R^7$ and $R^{10}$, alike or different, are —CN, $—COR^{11}$ in which $R^{11}$ is alkyl of 1 to 5 carbons, or $—COOR^{12}$ in which $R^{12}$ is alkyl of 1 to 6 carbons which may be interrupted by an oxygen atom, alkenyl of 2 to 5 carbons, or alkynyl of 2 to 5 carbons, or $R^7$ and $R^8$ together, or $R^9$ and $R^{10}$ together, complete a 6-membered carbocyclic ring containing a keto group.

In the formula for nitroaromatic compound described above the preferred alkyl groups are lower alkyl groups containing 1 to 6 carbon atoms. In the bis compounds, the term "hydrocarbylene" represents any divalent radical composed solely of carbon and hydrogen containing 1 to 18 carbon atoms. Typical radicals include o-, m-, and p-phenylene, vinylene, 2-butylene, 1,3-butadienylene, hexamethylene, octamethylene, octadecamethylene, naphthylene (1,2; 2,3; 1,4; and 1,5),

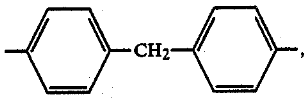
,
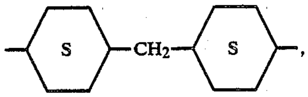
,
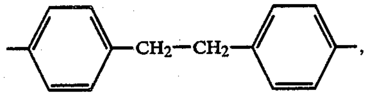
,
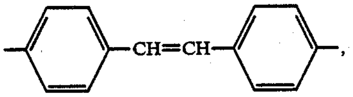
, and the like.

It has been found that the nature of the $R^5$ and $R^6$ substituents in the nitroaromatic compounds is very important. The unsubstituted compounds in which $R^5$ and $R^6$ are H do not seem to work satisfactorily. Furthermore, some $R^5$ and $R^6$ substituents deactivate the CH moiety toward rearrangement, for example, substituents which are normally considered to destabilize positive charges, such as nitro, cyano, carboxy and 2-pyridyl. It has been found, for instance, that

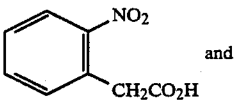
and
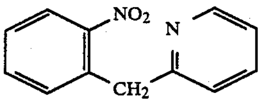

do not work in accordance with this invention.

Preferred nitroaromatic compounds include those wherein $R^1$ is H or methoxy;

$R^2$ and $R^3$ are H, alkoxy of 1 to 6 carbons, polyether of 2 to 18 carbons and 2 to 10 oxygens, alkyl of 1 to 6 carbons, or acetoxy; or $R^2$ and $R^3$, taken together, are $-OCH_2O-$ or $-(O-CH_2CH_2O)_5-$;

$R^4$ is H;

$R^5$ is H, alkyl of 1 to 6 carbons, alkoxy of 1 to 6 carbons; or phenyl $R^6$ is OH, alkoxy of 1 to 6 carbons, or phenoxy substituted with up to three chlorines, alkyls of 1 to 6 carbons, or alkoxys of 1 to 6 carbons; or $R^5$ and $R^6$, taken together, are $=O$, $=NC_6H_5$,

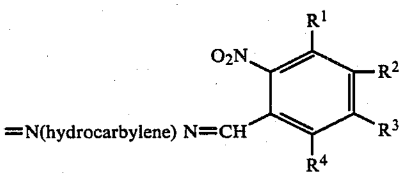

in which the hydrocarbylene group is of 2 to 6 carbons, =N (alkyl) in which alkyl is n-alkyl of 1 to 6 carbons or t-butyl, or

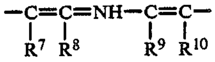

in which $R^8$ and $R^9$ are alike and are H or methyl, and $R^7$ and $R^{10}$ are alike and are —CN, —$COR^{11}$ in which $R^{11}$ is methyl or ethyl, or —$COOR^{12}$ in which $R^{12}$ is methyl or ethyl.

Particularly preferred, because the instant layers exhibit high imaging speeds, are nitroaromatic compounds wherein $R^1$ and $R^4$ are H;

$R^2$ and $R^3$ are alike and are alkoxy of 1 to 6 carbons;

$R^5$ is H, or alkyl of 1 to 6 carbons;

$R^6$ is alkoxy of 1 to 6 carbons, or phenoxy substituted with up to two alkoxys of 1 to 6 carbons; or $R^5$ and $R^6$, taken together, are $=O$ or $=NC_6H_5$.

Specific nitroaromatic compounds which are suitable include:

o-nitrobenzyl alcohol
o-nitrobenzaldehyde
α-phenyl-o-nitrobenzyl alcohol
o-(diphenylmethyl)nitrobenzene
α-phenylimino-o-nitrotoluene
α,α-diethoxy-o-nitrotoluene
α,α-ethylenedioxy-o-nitrotoluene
3-methoxy-2-nitrobenzaldehyde
4-methoxy-2-nitrobenzaldehyde
3,4-dimethoxy-2-nitrobenzaldehyde
3,4-dimethoxy-2-nitrobenzyl alcohol
4-cyano-2-nitrobenzaldehyde
5-hydroxy-2-nitrobenzaldehyde
4-hydroxy-3-methoxy-2-nitrobenzaldehyde
1-nitro-2-naphthaldehyde
2,3,4,5-tetramethyl-6-nitrobenzyl alcohol
3,4,5-trichloro-2-nitrobenzaldehyde
3,5-dibromo-4,6-dichloro-2-nitrobenzaldehyde
4,5-dimethoxy-2-nitrobenzyl alcohol
4,5-dimethoxy-2-nitrobenzaldehyde
2,4-dinitrobenzaldehyde
5-tolyl-2-nitrobenzaldehyde
5-benzyl-2-nitrobenzaldehyde
5-(m-chlorophenyl)-2-nitrobenzaldehyde
4-(2-methoxyethoxy)-2-nitrobenzaldehyde
4-ethoxyethyl-2-nitrobenzaldehyde
3-diethylamino-2-nitrobenzaldehyde
4-butylthio-2-nitrobenzaldehyde
4-phenylthio-2-nitrobenzaldehyde
2-nitrostyrene
4,5-dimethoxy-2-nitrostyrene
α-(p-dimethylaminophenyl)imino-2-nitrotoluene 4,5-dimethoxy-2-nitro-α-phenyliminotoluene
2-nitrostyrene oxide
2-nitrocumene
4,5-dimethoxy-2-nitrobenzyl chloride
α,α-ethylenedioxy-2-nitrotoluene
N,N'-bis(4,5-dimethoxy-2-nitrophenylmethylene)-1,6-hexanediamine
N,N'-bis(4,5-dimethoxy-2-nitrophenylmethylene)-2,5-hexanediamine
N,N'-bis(4,5-dimethoxy-2-nitrophenylmethylene)-m-phenylenediamine
N,N'-bis(4,5-dimethoxy-2-nitrophenylmethylene)-p-phenylenediamine
N,N'-bis(4,5-dimethoxy-2-nitrophenylmethylene)-α,α'-bi-p-toluidine N,N'-bis(4,5-dimethoxy-2-nitrophenylmethylene)-4,4'-stilbenediamine dimethyl ester of 2,6-dimethyl-4-(2'-nitrophenyl)-1,4-dihydropyridine-3,5-dicarboxylic acid diethyl ester of 2,6-dimethyl-4-(2'-nitrophenyl)-1,4-dihydropyridine-3,5-dicarboxylic acid diethyl ester of 2,6-dimethyl-4-(2'-nitro-4',5'-dimethoxy-phenyl)-1,4-dihydropyridine-3,5-dicarboxylic acid di-n-propyl ester of 2,6-dimethyl-4-(2'-nitrophenyl)-1,4-dihydropyridine-3,5-dicarboxylic acid diisopropyl ester of 2,6-dimethyl-4-(2'-nitrophenyl)-1,4-dihydropyridine-3,5-dicarboxylic acid di-(B-ethoxyethyl)ester of 2,6-dimethyl-4-(2'-nitrophenyl)-1,4-dihydropyridine-3,5-dicarboxylic acid diallyl ester of 2,6-dimethyl-4-(2'-nitrophenyl)-1,4-dihydropyridine-3,5-dicarboxylic acid dipropargyl ester of 2,6-dimethyl-4-(2'-nitrophenyl)-1,4-dihydropyridine-3,5-dicarboxylic acid 3-methyl-5-ethyl ester of 2,6-dimethyl-4-(2'-nitrophenyl)-1,4-dihydropyridine-3,5-dicarboxylic acid 3-isopropyl-5-methyl ester of 2,6-dimethyl-4-(2'-nitrophenyl)-1,4-dihydropyridine-3,5-dicarboxylic acid ethyl ester of 4-(2'-nitrophenyl)-2,6-dimethyl-3-aceto-1,4-dihydropyridine-5-carboxylic acid 2,6-dimethyl-4-(2'-nitrophenyl)-3,5-diaceto-1,4-dihydropyridine 2,6-dimethyl-4-(2'-nitrophenyl)-3,5-dicyano-1,4-dihydropyridine ethyl ester of 2-methyl-4-(2'-nitrophenyl)-1,4,5,6,7,8-hexahydro-5-oxoquinoline-3-carboxylic acid methyl ester of 2-methyl-4-(2'-nitrophenyl)-1,4,5,6,7,8-hexahydro-5-oxoquinoline-3-carboxylic acid isopropyl ester of 2-methyl-4-(2'-nitrophenyl)-1,4,5,6,7,8-hexahydro-5-oxoquinoline-3-carboxylic acid 1,2,3,4,5,6,7,8,9,10-decahydro-9-(2'-nitrophenyl)-1,8-dioxoacridine 1,2,3,4,5,6,7,8,9,10-decahydro-3,3,6,6-tetramethyl-9-(2'-nitrophenyl)-1,8-dioxoacridine 1-(2'-nitro-4',5'-dimethoxy)phenyl-1-(4-methoxy-phenoxy)ethane 1-(2'-nitro-4',5'-dimethoxy)phenyl-1-phenoxyethane 1-(2'-nitro-4',5'-dimethoxy)phenyl-1-(2,4-dimethyl-phenoxy)ethane 1-(2'-nitro-4',5'-dimethoxy)phenyl-1-(4-chloro-phenoxy)ethane 1-(2'-nitro-4',5'-dimethoxy)phenyl-1-(4-bromo-phenoxy)-ethane 1-(2'-nitro-4',5'-dimethoxy)phenyl-1-(2-naphthyloxy)ethane 1-(2'-nitro-4',5'-dimethoxy)phenyl-1-(2,4-dimethoxy-phenoxy)ethane 1-(2'-nitro-4',5'-dimethoxy)phenyl-1-(4-t-butyl-phenoxy)ethane 1-(2'-nitro-4',5'-dimethoxy)phenyl-1-(2-t-butyl-phenoxy)ethane 2-nitro-4,5-dimethoxy-α-methyliminotoluene 2-nitro-4,5-dimethoxy-α-t-butyliminotoluene 2-nitro-4,5-dimethoxy-α-n-butyliminotoluene 2-nitro-4,5-dimethoxy-α-n-hexyliminotoluene, and 1-(2'-nitro-4',5'-dimethoxy)phenyl-1-(2,4,5-trimethyl-phenoxy)ethane.

The nitroaromatic compounds are ordinarily employed in concentrations of about 0.5 to about 15.0% by weight based on total weight of the polymerizable composition. The preferred amount in any specific case will depend upon the particular monomer/free-radical generating system employed. In general, the preferred amount of nitroaromatic compound is about 1 to about 7% by weight based on total weight of polymerizable composition.

Visible Light Sensitizer

Useful visible light sensitizers include the arylylidene aryl ketone visible sensitizers which are disclosed in Dueber U.S. Pat. No. 4,162,162, the disclosure of which is incorporated herein by reference. Useful compounds of this type are of the formulae:

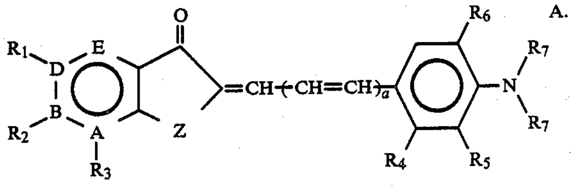

A.

wherein

A, B, D, E are carbon atoms or one may be solely a nitrogen atom;

$R_1$ is H, OH or $CH_3O$;

$R_2$ is H, OH, $CH_3O$ or $N(R_7)_2$;

$R_3$ is H, OH, or $CH_3O$;

a is 0 or 1;

Z is $>C{=}O$, $>CHOH$, $>C(CH_3)_2$, $-(CH_2)_b-$, wherein b is 1, 2 or 3,

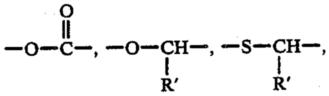

wherein R' is H, phenyl, or Z is linked with $R_4$ where Z is

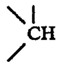

and $R_4$ is —O— or $>N—CH_3$, a being 0;

$R_4$ is H, $CH_3$, OH, $CH_3O$;

$R_5$ is H or $R_5+R_7$ is $—CH_2CH_2—$, $—CH_2CH_2CH_2—$, $—O—CH_2CH_2—$;

$R_6$ is H or $R_6+R_7$ is $—CH_2CH_2—$, $—CH_2CH_2CH_2—$, $O—CH_2CH_2—$; and $R_7$ is $CH_3$, $—(CH_2)_n—CH_3$ where n is 1 to 5, $—CH_2CH_2—Cl$, $—CH_2CH_2OH$, $CH_2CH_2OCH_3$;

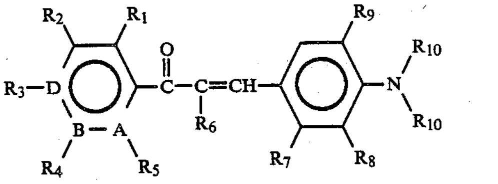

B.

wherein

A, B, D are carbon atoms or one may be solely a nitrogen atom;

$R_1$ is H, $CH_3$, $—OCH_2CH_2OR$, wherein R is H, $CH_3$, $—CH_2CH_2OR'$ wherein R' is $CH_3$ or $CH_3CH_2—$;

$R_2$ is H, $CH_3$, OH, or $CH_3O$;

$R_3$ is H, OH, $CH_3O$, $CH_3$, F, Br, CN or $N(R_{10})_2$;

$R_2+R_3$ is $—O—CH_2—O—$;

$R_4$ is H, $CH_3$ or $CH_3O$;

$R_5$ is H, $CH_3$, $—OCH_2CH_2OR$, wherein R is H, $CH_3$, $—CH_2CH_2OR'$ wherein R' is $CH_3$ or $CH_3CH_2—$;

$R_6$ is H, $CH_3$ or phenyl;

$R_7$ is H, $CH_3$, OH or $CH_3O$;

$R_8$ is H;

$R_8+R_{10}$ is $—CH_2CH_2—$, $—CH_2CH_2CH_2—$, $—OCH_2CH_2$;

$R_9$ is H, $R_9+R_{10}$ is $—CH_2CH_2—$, $—CH_2CH_2CH_2—$, $—OCH_2CH_2—$; and $R_{10}$ is $CH_3$, $—CH_2—_nCH_3$ wherein n is 1 to 5; and

C.

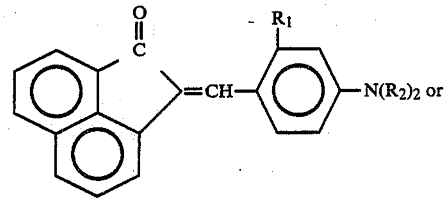

or

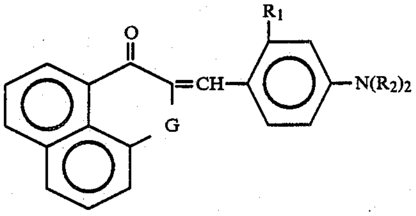

wherein

G is

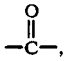,

—O—, or —S—;

$R_1$ is H, $CH_3$ or $—OCH_3$, and $R_2$ is $CH_3$ or $—CH_2CH_3$, the ketone having its maximum absorption in the range of 350 to 550 nm.

Preferred sensitizer compounds which are present in sensitizing amounts, generally 0.05 to 10% by weight, preferably 0.2 to 4% by weight based on the total weight of photopolymerizable composition, are of the following structures:

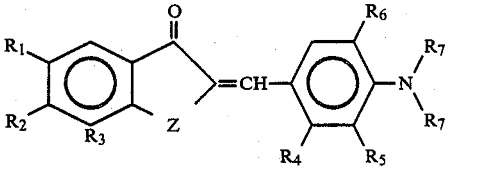

$R_1$ is H, OH, $CH_3O—$;

$R_2$ is H, OH, $CH_3O—$;

$R_3$ is H, OH, $CH_3O—$, with the proviso that if one of $R_1$, $R_2$, or $R_3$ is OH then the remainder must be H or $CH_3O—$;

Z is

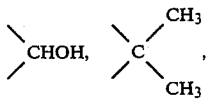, $(CH_2)_a$ wherein a is 1, 2 or 3,

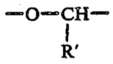

wherein

R' is H, phenyl, or

Z is linked with $R_4$ where Z is

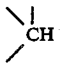

and $R_4$ is —O— or

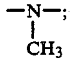;

$R_4$ is H, $CH_3$, OH, $CH_3O—$ with the proviso that if one of $R_1$, $R_2$, or $R_3$ is OH then $R_4$ is one of H, $CH_3$ or $CH_3O—$;

$R_5$ is H or $R_5+R_7$ is $CH_2CH_2—$, $—CH_2CH_2CH_2—$, $—O—CH_2CH_2—$;

$R_6$ is H or $R_6+R_7$ is $—CH_2CH_2—$, $—CH_2CH_2CH_2—$, $—O—CH_2CH_2—$;

$R_7$ is $CH_3—$, $CH_3CH_2—$;

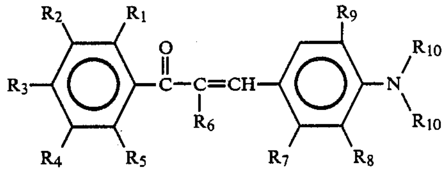

$R_1$ is H, $CH_3$;

$R_2$ is H, OH, $CH_3$, $CH_3O$;

$R_3$ is H, $CH_3$, OH, $CH_3O$;

$R_2+R_3$ is $—O—CH_2—O—$;

$R_4$ is H, $CH_3—$, $CH_3O—$;

$R_5$ is H, $CH_3$;

$R_6$ is H, $CH_3$;

$R_7$ is H, $CH_3$; OH, $CH_3O$ with the proviso that if one of $R_2$, $R_3$ or $R_7$ is OH then the remainder must H, $CH_3$ or $CH_3O—$;

$R_8$ is H, $R_8+R_{10}$ is $—CH_2CH_2$, $—CH_2CH_2CH_2—$, $—O—CH_2CH_2—$;

$R_9$ is H, $R_9+R_{10}$ is $—CH_2CH_2$, $—CH_2CH_2CH_2—$, $—O—CH_2CH_2—$;

$R_{10}$ is $CH_3—$, $CH_3CH_2—$.

Some useful sensitizers include:

2-(4'-diethylamino-2'-methylbenzylidene)-1-indanone 2-(4'-diethylaminobenzylidene)-3-hydroxy-1-indanone 8-(4'-dimethylaminobenzylidene)-acenaphthalene-7-one 2-(4'-diethylamino-2'-methylbenzylidene)-1-tetralone 4-diethylamino-2-methylbenzylideneacetophenone 4'-dimethylaminobenzylidene-4-dimethylaminoacetophenone 4'-diethylamino-2'-methylbenzylidene-2-(B-(B'-methoxyethoxy)-ethoxy)acetophenone 4'-diethylamino-2'-methylbenzylidene-2-methylacetophenone 4'-diethylamino-2'-methylbenzylidene-4-fluoroacetophenone 4'-diethylamino-2'-methylbenzylidene-4-cyanoacetophenone 2-(4'-diethylaminobenzylidene)-3-phenyl-1-chromanone 2-(4'-diethylaminobenzylidene)-1-chromanone 2-(4'-diethylaminobenzylidene)-chroman-1,3-dione 2-(4'-di(B-chloroethyl)aminobenzylidene)-3-hydroxy-1-indanone 2-(4'-diethylamino-2'-methylbenzylidene)-3-hydroxy-1-indanone 2-(4'-dimethylaminocinnamylidene)-3-hydroxy-1-indanone 2-(4'-diethylamino-2'-methylbenzylidene)-1-tetralone 2-(4'-diethylamino-2'-methylbenzylidene)-1-benzosuberone 2-(4'-diethylamino-2'-methylbenzylidene)-5,6-dimethoxy-1-indanone 4'-diethylamino-2'-methylbenzylidene-3,4-methylenedioxyacetophenone 4'-diethylamino-2'-methylbenzylidene-4-methoxyacetophenone 4'-diethylamino-2'-methylbenzylidene-3-methoxyacetophenone 4'-diethylamino-2'-methylbenzylidene-4-methylacetophenone 2-(4'-diethylamino-2'-methoxybenzylidene)-1-indanone 2-(9'-julolyidene)-1-indanone 2-(4'-diethylaminobenzylidene)-1-tetralone 2-(4'-diethylaminobenzylidene)-propiophenone 2-(4'-diethylamino-2'-methylbenzylidene)-propiophenone 4-diethylaminobenzylidene-deoxybenzoin 2-(4'-diethylaminobenzylidene)-1-indanone 2-(4'-diethylaminobenzylidene)-3-gemdimethyl-1-indanone 4'-diethylamino-2'-methylbenzylidene-4-hydroxyacetophenone 4'-dimethylaminobenzylidene-3-hydroxyacetophenone 2-(N-ethyl-1,2,3,4-tetrahydro-6-quinolylidene-1-chromanone.

The arylylidene aryl ketones can be prepared according to procedures set forth in Examples 1 and 32 of Assignee's U.S. Pat. No. 4,162,162 by reacting specific aryl ketones and p-dialkylaminoarylaldehydes. After purification, melting points and, ultraviolet spectral data can be determined as described in the above identified patent. The sensitizers absorb radiation in the broad spectral range of 300 to 700 nm. The maximum absorption ($A_{max}$) is in the range of 350 to 550 nm, preferably 400 to 500 nm.

The photohardenable composition preferably contains a chain transfer agent.

Any chain transfer agent (CTA) identified in the prior patents for use with HABI-initiated photopolymerizable systems can be used. For example, Baum et al. U.S. Pat. No. 3,652,275 lists N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis (mercaptoacetate), 4-acetamidothiophenol, mercaptosuccinic acid, dodecanethiol, and beta-mercaptoethanol. Others which can be used include various tertiary amines known in the art, 2-mercaptoethane sulfonic acid, 1-phenyl-4H-tetrazole-5-thiol, 6-mercaptopurine monohydrate, bis-(5-mercapto-1,3,4-thiodiazol-2-yl, 2-mercapto-5-nitrobenzimidazole, and 2-mercapto-4-sulfo-6-chlorobenzoxazole. The preferred CTA's are 2-mercaptobenzoxazole (2-MBO) and 2-mercaptobenzothiazole (2-MBT). 2-MBO and 2-MBT may be purified as illustrated below for 2-MBO:

2-MBO: Optimum Melting Point 193°-194° C.

(1) For slightly impure lots (m.p.: 191°-193° C.) the following procedure is employed:

A slurry of 300 g 2-MBO in 1500 ml methanol is stirred for 5 to 10 minutes and allowed to settle. Generally, the solvent layer assumes a red appearance due to impurities. The undissolved solid is filtered through #5 filter paper in a Buchner funnel with house vacuum. Solid is washed with cold methanol (1 100 ml portion, collected and dried in oven at 70°-80° C. for 3 to 5 hours, subsequently pulverized and dried for an additional hour. Yield is approximately 150 g (50%) of white powder, m.p. 193°-194° C.

(2) For impure lots (m.p. below 191° C.) the following procedure is used:

250 g brown 2-MBO, 50 g DARCO G-60, 1500 ml methylene chloride and 600 ml methanol are stirred in a 4 liter Erlenmeyer flask with gentle boiling for 30 to 40 minutes. The mixture is filtered hot through fast (#4) paper under low vacuum. The red liquor that is collected is concentrated under low vacuum until 2-MBO precipitates out of solution. 200 ml of fresh methanol is added, and the resulting slurry is agitated to break up large lumps. The slurry is filtered through slow (#5) paper and washed with 50 ml fresh methanol. The colorless precipitate is collected and dried at 70 to 80 degrees for 3 to 5 hours as above. Yield of product, melting above 192° C. is ca. 50%.

Additives

In addition to the primary ingredients and chain transfer agent, the photohardenable compositions can contain conventional ingredients such as co-initiators, thermal stabilizers, plasticizers, brighteners, UV absorbers, electron acceptors, electron donors, etc. The preferred thermal stabilizer is 1,4,4-trimethyl-2,3-diazobicyclo-(3.2.2-non-2-ene-N,N-dioxide (TAOBN). Leuco dyes can also be present, e.g., Leuco Malachite Green, Leuco Crystal Violet, and leuco dyes disclosed by Baum et al U.S. Pat. No. 3,652,275, column 7, line 40 to column 11, line 31, the disclosure of which is incorporated herein by reference, etc. and produce a printout image. Some leuco dyes, however, are not stable in a strongly acid environment.

Useful electron donors have an oxidation potential, $E_d$ of less than 2.5 eV and electron acceptors have a reduction potential, $E_a$ of larger than −3.0 eV. Specific electron donor compounds which must be different type compounds from the initiators described above include: aromatic amines, e.g., triphenyl amine, diphenyl amine, methyl diphenyl amine, N,N-dimethyl aniline, N,N-diethyl aniline, diethyl amine, triethyl amine, 1,4-diazabicyclo-[2.2.2]octane, N,N,N,N'-tetramethylbenzidine; arsenic, antimony, bismuth, phosphorous, and cyanide compounds, e.g., triphenyl arsine, triphenyl antimony, triphenyl bismuth, triphenyl phosphine, dimethylcyanamide, etc.; carbazole compounds, e.g., 9-ethyl carbazole, polyvinylcarbazole; olefins and cyclic aromatic compounds, e.g., naphthalene, cyanonaphthalene, 1,4-di-cyanonaphthalene, 1,1-diphenylethylene, indene, norbornadiene, quadricyclene; methoxy compounds, e.g., 2-methoxynaphthalene, 1,3,5-trimethoxybenzene, o-dimethoxybenzene, 3-methoxypyrene, 3,4-dimethoxy-N,N-dimethylaniline, 2,4-dimethoxy-N,N-dimethylaniline, 1,2-dimethoxy benzene; nitro compounds, e.g., nitrobenzene, p-dinitrobenzene; quinones, e.g., benzoquinone, electron acceptors, e.g., trinitrofluoreneone, p-biphenyl, pyridine, benzonitrile, dicyanobenzene, pyrene-3-carboxylic acid, benzacridine, anthracene, benzanthracene, pyrene-4-carboxylic acid, 4-azaphenanthrene, benzophenone, acetophenone, 2,6,9,10-tetracyanoanthracene, 4-methylbenzoate, etc. Triphenylamine is the preferred electron donor; biphenyl is a preferred electron acceptor.

Compositional Range

In general, the essential components should be used in the following approximate proportions: binder 40–80 percent, preferably 45–65 percent; monomer 15–40 percent; preferably 25–35; initiator 0.5–20 percent, preferably 0.5–10 percent; photoinhibitor 0.5–15 percent, preferably 1–7 percent; visible light sensitizer 0.05–10 percent, preferably 0.2–4 percent and preferably chain transfer agent 0–5 percent, preferably 0.005–2 percent. These are weight percentages based on total weight of the photopolymerizable system. The preferred proportions depend upon the particular compounds selected for each component. For example, a high conductivity monomer can be used in smaller amount than a low conductivity monomer, since the former will be more efficient in eliminating charge from unexposed areas. The maximum total amount of additives will ordinarily be about 15% based on the total weight of the photohardenable composition.

The Coating

The photohardenable layer is prepared by mixing the ingredients of the photopolymerizable system in a solvent such as methylene chloride, usually in a weight ratio of about 10:90 to 40:60, coating a substrate, and evaporating the solvent. Coating thickness should be uniform and about 4 to 18 μm, preferably 7 to 14 μm dry. Dry coating weight should be about 40 to 180 $mg/dm^2$, preferably 70 to 140 $mg/dm^2$.

The Support

The conductive support may be a metal plate, such as aluminum, copper, zinc, silver or the like; a conductive polymeric film; a support such as paper, glass, synthetic resin and the like which has been coated on one or both sides with a metal, conductive metal oxide, or metal halide by vapor deposition or sputtering chemical deposition; a support which has been coated with a conductive polymer; or a support which has been coated with a polymeric binder containing a metal, conductive metal oxide, metal halide, conductive polymer, carbon, or other conductive fillers.

Exposure

A special advantage of the photohardenable electrostatic master is that it can be used to prepare both positive and negative images. Positive images are prepared by a two-exposure procedure whereas negative images are prepared by a one-exposure technique. The photohardenable layers are exposed to radiation of wavelength in the 200–800 nm range.

Suitable sources of such radiation, in addition to sunlight, include carbon arcs, mercury-vapor arcs, fluorescent lamps with ultraviolet radiation-emitting phosphors, argon and xenon glow lamps, electronic flash units, photographic-flood lamps, and lasers. Other fluorescent radiation sources such as the tracings on the face of a cathode ray tube may be used. Electron accelerators and electron beam sources through an appropriate mask may also be used.

Where artificial radiation sources are used, the distance between the photosensitive layer and the radiation source may be varied according to the radiation sensitivity of the composition and the nature of the photopolymerizable compound. Customarily, mercury-vapor arcs are used at a distance of 1.5 to 60 inches from the photopolymerizable layer. Radiation fluxes of 10–10,000 $uw/cm^2$ are generally suitable for use.

During the first exposure in preparing a positive image, impinging radiation having a wavelength of about 200 to about 400 nm is used, but is not necessary that the wavelength be limited to this range. The radiation may have wavelengths over the entire range of about 200 to about 800 nm. In order to form an effective amount of inhibitor in the first exposure, at least about 80% of the radiation should be between about 200 and 400 nm; and preferably substantially limited to wavelengths of between 300 and 400 nm.

The radiation used during the second exposure should be substantially limited to wavelengths greater than about 400 nm. By "substantially limited" it is meant that the radiation is filtered to exclude greater than about 95% of the radiation at about 400 nm and below, or is otherwise limited to radiation greater than about 400 nm. Preferably, the radiation in the second exposure has wavelengths substantially limited to greater than about 400 to about 800 nm, and most preferably about 400 to about 600 nm.

Although all of the photopolymerizable layers of this invention can be imaged with the second exposure radiation having wavelengths down to about 380 nm, shorter exposure times are generally experienced when wavelengths up to about 400 nm are filtered out since many of the nitroaromatic compounds absorb radiation that far out into the visible range. During the second exposure, a greater portion of the coating, typically the entire coated area, is struck by radiation with the result that free radicals are generated and polymerization takes place in the areas struck by radiation during the second exposure but not during the first exposure.

The length of time for which the compositions are exposed to radiation may vary upward from fractions of a second. The exposure times will vary, in part, according to the nature and concentration of the polymerizable compound and initiator, photoinhibitor, visible light sensitizer and the type of radiation. Exposure can occur over a wide range of temperatures, as for example, from about −80° C. up to about +150° C. with selected compositions. Preferred exposure temperatures range from about −30° to about +35° C. There is an obvious economic advantage to operating the process at room temperature.

Imagewise exposure, for example in preparing electrostatic masters, is conveniently carried out by exposing a layer of the photoactive composition to radiation through a process transparency; that is, an image-bearing transparency consisting solely of areas substantially opaque and substantially transparent to the radiation being used where the opaque areas are substantially of the same optical density; for example, a so-called line or halftone negative or positive. Process transparencies may be constructed of any suitable materials including cellulose acetate film and polyethylene terephthalate film. An example is the preparation of a positive working electrostatic master using the novel system of this invention. In a positive imaging system, polymer is ultimately formed under the opaque areas of the process transparency; that is, the areas not struck by radiation passing through the transparency. Exposure of a master coated with the nitroaromatic compound-containing photoactive composition to the full spectrum of a mercury-vapor lamp through a filter which allows radiation between 300–400 nm to reach the master and the cellulose acetate or polyethylene terephthalate film negative causes rearrangement of the nitroaromatic compound to a nitrosoaromatic compound in the radiation-struck areas. The areas struck by radiation during the first exposure will become non-image areas since no polymerization will be initiated in these areas.

Removal of the process transparency followed by a second exposure of the master to radiation substantially limited to wavelengths greater than about 400 nm causes polymerization to occur in the areas which were not struck by radiation during the first exposure. Radiation of this wavelength is insufficiently absorbed by the nitroaromatic compound to rearrange it to a nitroso compound. The portions of the coating exposed in this manner become the polymeric image areas. The doubly exposed element provides a positive working master suitable for use in color proofing applications, etc.

Negative mode images are formed when the photohardenable electrostatic master is initially exposed to visible light, i.e., light of wavelengths greater than 400 nm. They may be used immediately after removal of the cover sheet, or they may be exposed to ultraviolet light, prior to charging and toning. The effect of the visible light exposure is to effect photopolymerization, i.e., to harden the coating to make it less photoconductive, and the purpose of the second, ultraviolet light exposure, with light of 200 to 400 nm is to form inhibitor, to prevent room light from effecting polymerization in the previously unexposed areas. If the film is used in a red-light environment, however, this latter ultraviolet light exposure is not required, since no polymerization will ensue in the absence of light.

The preferred charging means is corona discharge. Other charging methods, e.g., discharge of a capacitor, can also be used. Dry electrostatic toners are useful in the process. Any liquid electrostatic toner and any method of toner application can also be used. Preferred liquid electrostatic developers are suspensions of pigmented resin toner particles in nonpolar liquids which are charged with ionic or zwitterionic compounds. The nonpolar liquids normally used are the Isopar® branched-chain aliphatic hydrocarbons (sold by Exxon Corporation) which have a Kauri-butanol value of less than 30 and optionally containing various adjuvants are described in Mitchell U.S. Pat. Nos. 4,631,244 and 4,663,264, Taggi U.S. Pat. No. 4,670,370 and Assignee's following U.S. patent application Ser. Nos. 804,385, filed Dec. 4, 1985, 854,610 filed Apr. 22, 1986, 856,392 filed Apr. 28, 1986, 857,326 and 857,349 both filed Apr. 30, 1986, and 880,155 filed June 30, 1986. These are narrow high-purity cuts of isoparaffinic hydrocarbon fractions with the following boiling ranges Isopar®-G, 157°–176° C., Isopar®-H 176°–192° C., Isopar®-K 177°–197° C., Isopar®-L 188°–206° C., Isopar®-M 207°–254° C., Isopar®-V 254°–329° C. Preferred resins having an average particle size of less than 10 μm are copolymers of ethylene (80 to 99.9%) acrylic or methacrylic acid (20 to 0%) alkyl of acrylic or methacrylic acid where alkyl is 1 to 5 carbon atoms (0 to 20%), e.g., copolymers of ethylene (89%) and methacrylic acid (11%) having a melt index at 190° C. of 100. Preferred nonpolar liquid soluble ionic or zwitterionic components are lecithin and Basic Barium Petronate® oil-soluble petroleum sulfonate manufactured by Sonneborn Division, Witco Chemical Corp., New York, NY. Many of the monomers useful in the photohardenable composition are soluble in these Isopar® hydrocarbons, especially in Isopar®-L. Consequently, repeated toning with Isopar® based toners to make multiple copies can deteriorate the electrical properties of the master by extraction of monomer from unexposed areas. The preferred monomers are relatively insoluble in Isopar® hydrocarbons, and extended contact with these liquids does not unduly deteriorate films made with these monomers. Photohardenable electrostatic masters made with other, more soluble monomers can still be used to make multiple copies, using liquid toner having a dispersant with less solvent action.

After developing, the toner image is transferred to another surface, such as paper for the preparation of a proof. Other receptors or surfaces include polymeric film, cloth, etc. For making integrated circuit boards, the transfer surface can be an insulating board on which conductive circuit lines can be printed by this process, or it can be an insulating board covered with a conductor (e.g., a fiber glass board covered with a copper layer) on which a resist is printed by this process. Transfer is accomplished by electrostatic or other means, e.g., by contact with an adhesive receptor surface. Electrostatic transfer can be accomplished in any known manner, e.g., by placing the transfer surface in contact with the toned image, applying a squeegee to assure maximum contact, and applying corona discharge to the backside of the transfer element. It is preferred to transfer the image across a gap, e.g., 6 μm.

INDUSTRIAL APPLICABILITY

The photohardenable electrostatic master is particularly useful in the graphic arts field, particularly in the area of color proofing wherein the proofs prepared duplicate the images achieved by printing. The photohardenable electrostatic masters of the invention satisfy the proofing needs of all printers whether they work with positive or negative color separations because one such master is capable of producing either positive or negative images. Other uses for the photohardenable master include making integrated circuit boards and printing plates.

EXAMPLES

The following examples illustrate but do not limit the invention wherein the percentages and parts are by weight. In the examples, ingredient designations have the following meanings

BINDERS

PMMA: polymethylmethacrylate $\eta=1.25$, where $\eta$ is the inherent viscosity Tg=95° C., where Tg is the glass transition temperature PSMMA: poly(styrene/methylmethacrylate)(70/30)

MONOMERS

TMPEOTA: ethoxylated trimethylol propane triacrylate

INITIATORS o-CL-HABI: 2,2'-bis(o-chlorophenyl)-4,4'-5,5'-tetraphenylbiimidazole CDM-HABI: 2,2'-bis(o-chlorophenyl)-4,4',5,5'-tetrakis(m-methoxyphenyl)-biimidazole

CHAIN TRANSFER AGENTS

2-MBO: 2-mercaptobenzoxazole

2-MBT: 2-mercaptobenzothiazole

PHOTOINHIBITORS

6-NVA: 4,5-dimethoxy-2-nitrobenzaldehyde a-METHYL BPE: 1-(2'-nitro-4',5'-dimethoxy)phenyl-1-(4-t-butyl phenoxy)ethane DHP-M: dimethyl ester of 2,6-dimethyl-4-(2'-nitrophenyl)-1,4-dihydropyridine-3,5-dicarboxylic acid

SENSITIZERS

DABC: 2-(4'-diethylaminobenzylidene)-1-chromanone

DBI: 2(4'-diethylamino-2'-methylbenzylidene-1-indanone

ETQC: 2-(N-ethyl-1,2,3,4-tetrahydro-6-quinolylidene)-1-chromanone

ADDITIVES

TLA-454: tris-(o-methyl-p-diethylaminophenyl)-methane

LCV: Leuco Crystal Violet p-TSA: p-toluene sulfonic acid

In the following examples parts and percentages are by weight. The numerals in Example 1 are identical with those shown in FIG. 1 and FIG. 2.

EXAMPLE 1

A photopolymerizable element (1) was prepared having a 0.004 inch (0.0102 cm) aluminized polyethylene terephthalate support (2) and a 0.00075 inch (0.002 cm) polypropylene cover sheet (not shown in FIG. 1). The photopolymerizable layer (3) had the following composition:

| INGREDIENT | AMOUNT |
|---|---|
| o-CL HABI | 30.4 |
| CDM HABI | 30.4 |
| α-METHYL BPE | 41.4 |
| 2-MBO | 1.4 |
| TLA-454 | 20.7 |
| LCV | 5.46 |
| DABC | 6.86 |
| ETQC | 6.86 |
| TMPEOTA | 413.0 |
| PSMMA | 843.5 |

The coating weight of the photopolymerizable layer was 119 mg/dm$^2$. The photopolymerizable element (1) was exposed, e.g., through a negative color separation (5), for 30 seconds using PER-105 daylight (visible light 6) fluorescent lamps having an intensity of 3.4 mw/cm$^2$ at the surface of the photopolymerizable element. The lamp output was measured with an IL-1700 Research Radiometer with an XRD140A detector from International Light Inc., Newburyport, MA. The cover sheet was peeled off leaving an element that retained charge in the polymerized areas. Charge decay data showing charge retention after exposure to visible light was obtained in the following manner. Strips of film measuring 1.5 inches (3.81 cm) wide by 6 inches (15.24 cm) long were prepared. The bottom 3 inches were covered to prevent polymerization and the top 3 inches (7.62 cm) were exposed as indicated above. After exposure, the film was placed on a movable metal plate (not shown in FIG. 1) and grounded (7) with copper tape. The film was then transported at the rate of 1 inch-/second (2.54 cm/second) under a single wire positive corona (8) powered by a Model 251 Coronaply II Power Supply and the retained voltage in the exposed photopolymer (9) was measured with a Model 244 Isoprobe Electrostatic Voltmeter as a function of time after charging as shown in Table 1 below. The power supply and voltmeter were from Monroe Electronics, Lyndonville, NY.

TABLE 1

| Time after Charging (seconds) | Voltage Retained After 30 Seconds Visible Exposure | Unexposed Area |
|---|---|---|
| 0 | 1064 | 51 |
| 5 | 848 | 9 |
| 10 | 722 | 5 |
| 15 | 648 | 3 |
| 60 | 366 | |
| 120 | 250 | |

A similarly prepared photopolymerizable element was given a 1 minute exposure to black-light blue fluorescent lamps of 1.1 mw/cm$^2$ intensity. The cover sheet was peeled off leaving an element which did not retain charge in the area exposed to the UV radiation. Charge decay data showing the absence of retained charge in the UV struck areas was obtained as above and is shown in Table 2.

TABLE 2

| Time after Charging (seconds) | Voltage Retained After 1 Minute UV Exposure | Unexposed Area |
|---|---|---|
| 0 | 20 | 51 |
| 5 | 0 | 9 |
| 15 | 0 | 3 |
| 30 | 0 | 0 |

Figure 2:
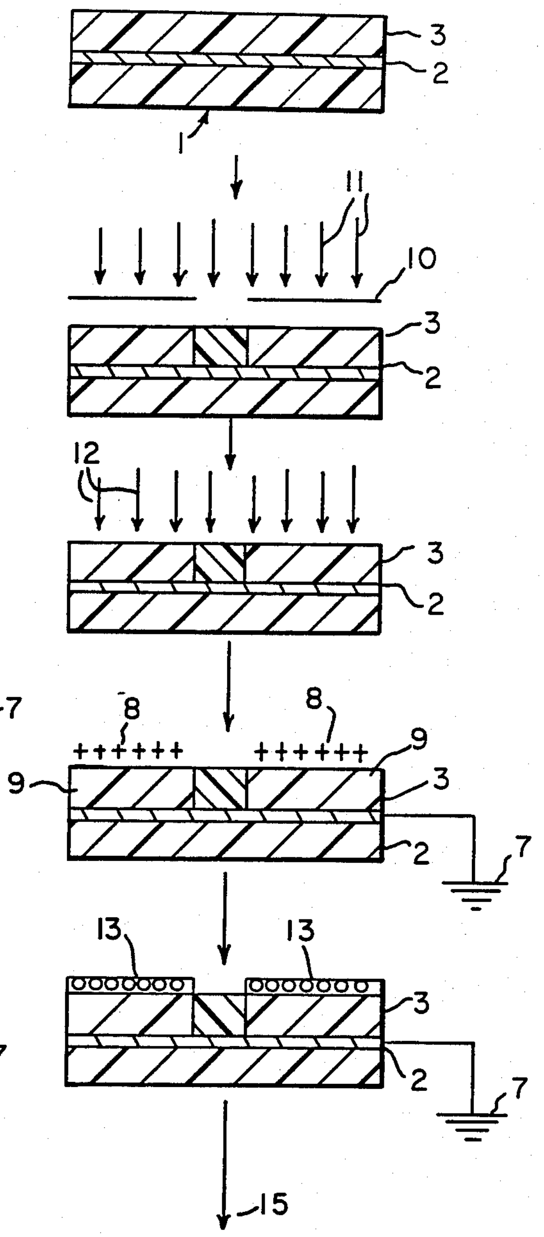
FIG. 2 illustrates a schematic flow chart of the basic process for forming a positive image from a photohardenable electrostatic master.

As illustrated in FIG. 2 a third sample of the photopolymerizable element (1) was exposed, e.g., through a positive color separation (10) for 1 minute with UV radiation (11). After removal of the color separation, the element was given a second overall exposure of 30 seconds to visible light (12). After the cover sheet was peeled off, the sample was charged by positive corona (8) as the previous two samples, and the charge decay data shown in Table 3 was measured.

TABLE 3

| Time After Charging (seconds) | Voltage Retained After Dual Exposure | Voltage Retained After Single 30 Second Visible Exposure |
|---|---|---|
| 0 | 36 | 1064 |
| 5 | 2 | 848 |
| 10 | 0 | 722 |

Table 3 shows that the first UV exposure (11) deactivated the photopolymer and prevented the second 30 second visible light exposure (12) from polymerizing the photopolymer element.

Positive and negative toned images were produced from the photopolymerizable element prepared as described earlier as follows. Four 1.5 by 6 inch (3.81×15.24 cm) strips of the photopolymerizable element were prepared as described earlier and a Stouffer Graphic Arts step tablet phototool was placed over each sample. One strip was exposed for 1 minute with UV radiation using the light source described earlier, a second strip was exposed for 1 minute with visible light (6) as described earlier, the third and fourth strips were exposed for 1 minute with UV radiation (11) followed by 1 minute and 0.5 minute of visible light (12), respectively. After exposure, the cover sheets were peeled off, and the four samples were wet with Isopar®-L, mounted on an aluminum plate and grounded (7) to the plate with copper tape. The aluminum plate was connected to real ground and mounted on a screw driven variable speed flat bed carrier which moves at the rate of 0.5 inch/sec over a positive single wire corotron charged to 4.5 to 6 kV. Fifteen seconds after corona charging (8), the plate with the mounted samples passed over a wave of negatively charged black liquid toner (13) comprising aluminum tristearate adjuvant and Basic Barium Petronate® charge director similar to that described in Assignee's U.S.S.N 857,326 filed Apr. 30, 1986 having a conductivity of 10-15 pmhos/cm and 0.5% solids concentration which formed a meniscus with the sample and deposited toner on the polymerized areas of the samples. After toning, the images were fused in a 105-110 degree centigrade oven for 5 minutes. The results show Sample 1 which was exposed for 1 minute to UV deactivating radiation did not accept any toner. Sample 2 exposed for 1 minute with polymerizing visible light produced a negative image of the Stouffer Target having 6 toned steps (which could be subsequently transferred 14). Samples 3 and 4, exposed to 1 minute UV radiation followed by 1 and 0.5 minute visible light, respectively produced positive images (which could be subsequently transferred 15) of the Stouffer target having 1 and 3 untoned steps followed by completely toned steps.

Image quality in the negative mode was determined by placing the emulsion side of an URGA target that included 0.5% highlight dots to 99.5% shadow dots on top of the photopolymerizable layer of a 1 inch×7 inch (2.54 cm×17.8 cm) strip of a photopolymerizable element prepared as described earlier in a Douthitt exposure unit (Douthitt Corp., Detroit, MI), equipped with a Theimer Violux Model TU64a lamp housing and a 5 KW, 5027 photopolymer bulb, drawing vacuum for 60 seconds to obtain good contact between the target and the photopolymerizable layer and exposing the photopolymerizable layer for 35 seconds through a Dylux® Clearing Filter (DCF) sold by E. I. du Pont de Nemours and Company of Wilmington DE. The DCF filtered out radiation shorter than 400 nm. Seven other elements were so exposed with the exposure time varied from 40 to 70 seconds as shown in Table 4 below. The lamp output was measured as 1.41 $mw/cm^2$. After exposure, the cover sheet was peeled off and the exposed element was charged and toned as described above. The results for the untransferred negative toner image on the master are shown in Table 4.

TABLE 4

| Exposure Time (seconds) | Toned steps | Percent dot range |
|---|---|---|
| 35 | 1 | 3-9B |
| 40 | 2 | 3-99 |
| 45 | 2 | 3-99 |
| 50 | 3 | 3-99 |
| 51 | 3 | 2-99 |
| 60 | 4 | 2-99 |
| 65 | 4 | 2-99 |
| 70 | 4 | 2-99.5 |

Excellent quality negative images of 2 to 99% dots were obtained with exposures ranging from 55 to 70 seconds.

Positive images were prepared by imagewise exposing six photopolymerizable elements prepared as described earlier to exposures of 10, 20, 30, 40, 50, and 60 seconds, respectively. The exposures were made in a Douthitt exposure device through a Kokomo® Glass Filter (400), Kokomo Opalescent Glass Co., Kokomo, IN. The Kokomo® filter primarily allowed only wavelengths between 300 and 400 nm to pass through it. The lamp output was measured at 1.39 mw/square cm. Again UGRA targets were placed over the photopolymerizable layer of the photopolymerizable element and a 60 second vacuum drawdown time was used for each exposure. After the UV exposure, each sample was given an overall exposure of 55 seconds to visible light through a DCF filter. The cover sheet was peeled off, and the exposed element was charged and toned as described earlier. Results for the untransferred positive toner image on the master are shown in Table 5.

TABLE 5

| UV Exposure Time (seconds) | # Untoned Steps | % Dot Range |
|---|---|---|
| 10 | 0 | 1-98 |
| 20 | 1 | 2-99 |
| 30 | 2 | 3-99.5 |
| 40 | 3 | 4-99.5 |
| 50 | 3 | 5-99.5 |
| 60 | 4 | 5-99.5 |

Excellent quality positive images of 1-98 and 2-99% dots were obtained at 10 to 20 seconds UV exposure followed by an overall 55 second visible exposure.

To study the effect of an exposure time delay between the imagewise UV deactivation exposure and the overall visible polymerization exposure on image quality, the time between the two exposures was varied from 1 to 20 minutes. The image quality obtained was identical for all hold times studied showing good latent image stability of the deactivation species formed during imagewise UV exposure.

A photopolymerizable element similar to that described earlier was imaged for 20 seconds through a Kokomo® Glass filter in a Douthitt exposure unit using a Cromalin® offset com guide positive target, sold by E. I. du Pont de Nemours and Company, Wilmington, DE. The UV exposure was followed by a an overall visible exposure through a DCF filter for 60 seconds. The cover sheet was peeled off the exposed element, and the element was then charged electrostatically, the resulting electrostatic image was toned with liquid electrostatic toner of opposite polarity, and the toned image was electrostatically transferred from the master to paper. The film was charged with a scorotron having an open grid, spaced 0.5 mm from the element and operated at 180 V and a wire operated at 4.8 kV. The element was then toned 1.6 seconds after charging using the black liquid electrostatic toner at 1.5% solids concentration described earlier. The excess toner was removed from the element with a metering roll spaced 0.004 inch (0.10 mm) from the element. The metering roll is biased from 0 to 300 V, if necessary, to remove toner from the background non-image areas, and the toner image was transferred to Champion Textweb® paper 60#, Champion Paper Co., Stanford, CT using a combination of a conductive rubber roller, operated at −2 to −6 kV, and a transfer corotron, operated at +4.0 to +5.5 kV. The paper was placed between the toned element and the conductive rubber roller so the paper was in contact with the toner image. The paper was then passed under the corotron causing the toner image on the element to be transferred to the paper. The image was then fixed to the paper by fusing at 110° C. for 1 minute. Solid density was 1.72 measured with a Macbeth Model RD-918 Densitometer from Kollmorgan Corp., Newburgh, NY, and dot gain for 50% dots was 14.9%. A dot range of 2–98% was obtained. The image was sharp and an excellent reproduction of the positive target.

EXAMPLE 2

A photopolymerizable element was prepared having a 0.004 inch (0.0102 cm) aluminized polyethylene terephthalate support and a 0.00075 inch (0.002 cm) polypropylene cover sheet. The photopolymerizable layer had the following composition:

| INGREDIENT | WEIGHT (%) |
|---|---|
| o-CL HABI | 2.17 |
| CDM HABI | 2.17 |
| 6-NVA | 1.73 |
| 2-MBO | 0.10 |
| TLA-454 | 1.48 |
| LCV | 0.39 |
| DBI | 0.65 |
| TMPEOTA | 31.06 |
| PSMMA | 60.25 |

The coating weight of the photopolymerizable layer was 120 mg/dm$^2$. Six photopolymerizable elements were imagewise exposed for 5, 10, 15, 20, 30, and 60 seconds respectively in a Douthitt exposure unit through a DCF filter. The lamp output was 1.4 mw/cm$^2$. The cover sheet was peeled off, and the exposed element was charged and charge/decay data was obtained as described in Example 1. Results are shown in Table 6 below.

TABLE 6

| | Voltage Retained After Visable Exposure | | | | | |
|---|---|---|---|---|---|---|
| Seconds After Charging | | | | | | |
| 0 | 861 | 1076 | 1282 | 1015 | 1114 | 1269 |
| 5 | 485 | 798 | 580 | 741 | 878 | 998 |
| 10 | 358 | 622 | 453 | 590 | 729 | 892 |
| 15 | 300 | 460 | 355 | 479 | 837 | 800 |
| 30 | 222 | 249 | 209 | 282 | 446 | 634 |
| 45 | 181 | 173 | 150 | 191 | 337 | 529 |
| 60 | 158 | 153 | 119 | 135 | 262 | 454 |
| 120 | 99 | 118 | 76 | 51 | 126 | 290 |
| Exposure (Seconds) | 5 | 10 | 15 | 20 | 30 | 60 |

The above data shows that visible light caused polymerization to occur and that charge is retained by the polymerized film.

Four similarly prepared photopolymerizable elements having a photopolymerizable layer comprising a 6-NVA photoinhibitor and DBI as a visible sensitizer were imagewise exposed in a Douthitt exposure unit through a UV light transmitting, visible light absorbing Kokomo® Glass Filter for 10, 20, 30, and 60 seconds, respectively. The elements were then given an overall 20 second exposure through a DCF filter. The cover sheets were peeled off, and the elements were charged, toned and charge/decay data were obtained as described in Example 1. Results are shown in Table 7.

TABLE 7

| Sec. After Charging | Voltage Retained After Dual Exposure Sample No. 1 | 2 | 3 | 4 |
|---|---|---|---|---|
| 0 | 409 | 54 | 40 | 34 |
| 5 | 118 | 8 | 10 | 5 |
| 10 | 49 | 4 | 7 | 3 |
| 15 | 27 | 3 | 6 | 3 |
| 30 | 9 | 2 | 5 | 2 |
| 60 | 3 | 2 | 3 | 2 |
| 120 | 2 | 0 | 2 | 0 |

The above data show increasing amounts of deactivation by longer exposure to UV radiation in the first exposure which hinders polymerization in the second exposure to visible light.

Image quality in the negative mode was determined by placing the emulsion side of an UGRA target on top of the photopolymerizable element in a Douthitt Option X exposure unit (Douthitt Corporation, Detroit, MI), equipped with a Theimer Violux Tu64a lamp housing with 5027 photopolymer bulb, drawing vacuum for about 60 seconds to obtain good contact between the target and the photopolymerizable element and exposing the element through a DCF filter. The lamp output was measured at 0.98 mw/cm$^2$. After exposure the cover sheet was peeled off, and the element was charged electrostatically, the resulting electrostatic image was toned with a liquid electrostatic toner of opposite polarity, and the toner image was electrostatically transferred from the element to the paper using the procedure described in Example 1 with the following exceptions: The grid voltage was set at 260 volts, the corona current, Ic was 550 micro amps, the conductive rubber roller was set at −3.5 kV, the transfer corotron was operated at 4 kV, the magenta toner (1.5% solids concentration) used was similar to that described in Example 10 of Assignee's U.S. Ser. No. 857,326 filed Apr. 30, 1986 wherein the lecithin charge director was replaced by Basic Barium Petronate®, and the toner has a conductivity of 14 pmhos/cm. The paper used was Solitaire® paper 60#, Plainwell Paper Co., Plainwell, MI, and the transferred image was fused at 113° C. for 1 minute. Four samples were prepared using exposure energies of 20, 25, 30, and 35 mj/cm$^2$. Results are shown in Table 8.

TABLE 8

| | Sample No. 1 | 2 | 3 | 4 |
|---|---|---|---|---|
| Exposure Energy (mj/cm$^2$) | 20 | 25 | 30 | 35 |
| Toned Stouffer Steps | 2.5 | 3 | 3.5 | 4 |
| % Dot Range | — | 2.5–98 | 2–97 | 2–97 |
| % Dot Gain | — | 14 | 15 | 14 |
| Top Density | — | 1.09 | 1.10 | 1.37 |

Four photopolymerizable elements having the photopolymerizable composition outlined earlier in this example were prepared and image quality of a transferred image on paper was determined using different UV exposure conditions for each of these elements. The elements were first exposed imagewise through an UGRA target and a Kokomo® Glass filter, Kokomo Opalescent Glass Co., Kokomo, IN in a Douthitt Option X exposure unit similar to that described earlier. The lamp output was determined to be 1.0 mw/cm$^2$ through the Kokomo® Glass filter. Following the UV exposure, the elements were subjected to a second overall visible exposure through a DCF filter in the same exposure unit. The lamp output was determined to be 0.98 mw/$cm^2$ through the DCF filter. The cover sheet was peeled off each exposed element, and the elements were charged, toned and the toner image transferred using the method described earlier for determining the image quality in the negative mode with the following exceptions: the grid voltage was maintained at 270 volts instead of 260 volts. Results are shown in Table 9.

TABLE 9

| | Sample No. | | | |
|---|---|---|---|---|
| | 1 | 2 | 3 | 4 |
| UV exposure energy (mj/$cm^2$) | 7.5 | 10 | 15 | 21 |
| Visible exposure energy (m/$cm^2$) | 35 | 35 | 35 | 35 |
| Untoned Stouffer Steps | 1 | 1.5 | 3 | 3.5 |
| % Dot Range | 2–97 | 2–98 | 4–98 | 3–98 |
| % Dot Gain | 14 | 12 | 10 | 9 |
| Top Density | 1.28 | 1.40 | 1.43 | 1.37 |

This example demonstrates the use of 6-NVA UV generated photoinhibitor and DBI visible photosensitizer in a dual response electrostatic imaging composition useful for making negative and positive images depending on the exposure sequence.

EXAMPLE 3

The procedure used to determine image quality in the negative and positive modes described in Example 2 was repeated with the following exceptions: The photopolymerizable layer had the following composition:

| INGREDIENT | WEIGHT (GMS) |
|---|---|
| o-CL HABI | 30.4 |
| CDM HABI | 30.4 |
| DHP-M | 55.2 |
| 2-MBO | 1.4 |
| TLA-454 | 46.2 |
| P-TSA | 46.2 |
| LCV | 5.46 |
| DABC | 6.86 |
| ETQC | 6.86 |
| TMPEOTA | 413.4 |
| PSMMA | 752.6 |

The photopolymerizable layer has a coating weight of 117 mg/$cm^2$. The toner used had a conductivity of 11 pmhos/cm image quality in the negative mode is shown in Table 10 an that in the positive mode is shown in Table 11.

TABLE 10

| | Sample No. | | | |
|---|---|---|---|---|
| | 1 | 2 | 3 | 4 |
| UV Exposure Time (secs) | 10 | 15 | 20 | 30 |
| Exposure Energy (mj/$cm^2$) | 17.8 | 27 | 36.4 | 56 |
| % Dot Range | 2–98 | 3–98 | 2–97 | 2–97 |
| % Dot Gain | 7 | 8 | 13 | 14 |
| Top Density | 1.14 | 1.49 | 1.60 | 1.64 |

Excellent image quality of 3–98% dots at a density of 1.49 and a dot gain of 8% was achieved in the negative mode with DHP-M in a dual response electrostatic imaging composition.

TABLE 11

| | Sample No. | | | |
|---|---|---|---|---|
| | 1 | 2 | 3 | 4 |
| UV Exposure Energy (mj/$cm^2$) | 5.1 | 8.5 | 12.2 | 18.1 |
| Visible Exposure Energy (mj/$cm^2$) | 28.3 | 28.3 | 28.3 | 28.3 |
| # of Untoned Stouffer Steps | 1 | 1.5 | 2.5 | 3.5 |
| % Dot Range | 2–97 | 2–98 | 4–98 | 3–99 |
| % Dot Gain | 12 | 10 | 5 | 5 |
| Top Density | 1.35 | 1.41 | 1.31 | 1.27 |

Excellent image quality of 2–98% dots at 1.41 density and a dot gain of 10% was achieved in the positive mode with DHP-M. This example shows an electrostatic imaging composition containing DHP-M works equally well in producing positive or negative images depending on the exposure sequence.

EXAMPLE 4

A photopolymerizable element was prepared having a 0.004 inch (0.01 cm) aluminized polyethylene terephthalate support and a 0.00075 inch (0.002 cm) polypropylene cover sheet. The photopolymerizable layer had the following composition:

| INGREDIENT | WEIGHT (GMS) |
|---|---|
| o-CL HABI | 30.4 |
| CDM HABI | 30.4 |
| α-METHYL BPE | 41.44 |
| 2-MBO | 1.4 |
| TLA-454 | 46.2 |
| p-TSA | 46.2 |
| LCV | 5.46 |
| DABC | 6.86 |
| ETQC | 6.86 |
| TMPEOTA | 413.4 |
| PSMMA | 771.4 |

The photopolymerizable layer had a coating weight of 155 mg/$dm^2$.

Charge/decay data for the above photopolymerizable element was measured as described in Example 1 and is outlined in Tables 12, and 13 below. Table 12 shows charge retention after exposure to visible light. Table 13 shows charge retention after a dual exposure of UV radiation followed by visible radiation of 20 seconds.

TABLE 12

| | Voltage Retained After Visible Exposure | | | | | |
|---|---|---|---|---|---|---|
| Seconds After Charging | | | | | | |
| 0 | 70 | 196 | 425 | 618 | 844 | 971 |
| 5 | 15 | 57 | 182 | 323 | 575 | 781 |
| 10 | 5 | 31 | 117 | 220 | 442 | 672 |
| 15 | 2 | 18 | 82 | 168 | 359 | 595 |
| 30 | 0 | 5 | 35 | 90 | 225 | 450 |
| 45 | 0 | 2 | 22 | 60 | 167 | 363 |
| 60 | 0 | 2 | 14 | 42 | 127 | 307 |
| 120 | 0 | 0 | 3 | 17 | 67 | 193 |
| Visible Exposure (seconds) | 5 | 10 | 15 | 20 | 30 | 60 |

These data show that visible light causes polymerization to occur and that charge is retained in the exposed areas of the polymerized film.

TABLE 13

| Seconds After Charging | Volts Retained After Dual Exposure | | | |
|---|---|---|---|---|
| 0 | 206 | 14 | 10 | 8 |
| 5 | 79 | 6 | 3 | 3 |
| 10 | 44 | 4 | 3 | 3 |
| 15 | 28 | 4 | 2 | 3 |
| 30 | 11 | 3 | 2 | 3 |
| 60 | 4 | 3 | 2 | 0 |
| UV Exposure (seconds) | 10 | 20 | 30 | 60 |
| Visible Exposure (seconds) | 20 | 20 | 20 | 20 |

These data show deactivation by UV radiation which prevents polymerization to occur in the UV exposed areas upon exposure to visible radiation.

Image quality was determined as described in Example 2 with the following exceptions: the photopolymerizable element used was the one described earlier in this example. The grid voltage was set at 180 volts and the conductive rubber roller was set at −4 kV. Results for the negative mode are shown in Table 14, and results for the positive mode are shown in Table 15 below.

TABLE 14

| | Sample No. | | | |
|---|---|---|---|---|
| | 1 | 2 | 3 | 4 |
| Visible Exposure Energy ($mj/cm^2$) | 26.6 | 37.6 | 55 | 74.7 |
| # Toned Stouffer Steps | 3.5 | 4.5 | 5 | 7 |
| % Dot Range | 2–98 | 2–97 | 2–97 | 2–96 |
| % Dot Gain | 12 | 12 | 15 | 16 |
| Top Density | 1.37 | 1.47 | 1.54 | 1.55 |

TABLE 15

| | Sample No. | | | |
|---|---|---|---|---|
| | 1 | 2 | 3 | 4 |
| UV Energy ($mj/cm^2$) | 7 | 11 | 13.5 | 22 |
| Visible energy ($mj/cm^2$) | 35.4 | 35.4 | 35.4 | 35.4 |
| # Untoned Stouffer Steps | 1 | 2 | 1.5 | 2.5 |
| % Dot Range | 2–97 | 2–97 | 2–98 | 2–98 |
| % Dot Gain | 12 | 10 | 7 | 9 |
| Top Density | 1.41 | 1.42 | 1.40 | 1.43 |

Excellent exposure latitude is achieved with the α-METHYL BPE photoinhibitor in combination with DABC and ETQC visible sensitizers.

EXAMPLE 5

Image quality for the negative and positive modes were determined as described in Example 4 with the following exceptions: The photopolymerizable layer had the following composition:

| INGREDIENT | WEIGHT (GMS) |
|---|---|
| o-CL HABI | 15.2 |
| CDM HABI | 15.2 |
| α-METHYL BPE | 41.4 |
| 2-MBO | 14.0 |
| TLA-454 | 46.2 |
| P-TSA | 46.2 |
| ETQC | 6.86 |
| TMPEOTA | 423.8 |
| PSMMA | 790.8 |

The photopolymerizable layer had a coating weight of 123 $mg/dm^2$.

The grid voltage was maintained at 145 volts for the negative mode and 200 volts for the positive mode. Results for the negative mode are provided in Table 16 and results for the positive mode are shown in Table 17 below.

TABLE 16

| | Sample No. | | | |
|---|---|---|---|---|
| | 1 | 2 | 3 | 4 |
| Visible Exposure Energy ($mj/cm^2$) | 18.5 | 28.6 | 38.5 | 54 |
| # Toned Stouffer Steps | 4.5 | 5.5 | 7 | 8.5 |
| % Dot Range | 2–97 | 1–96 | 1–96 | 1–95 |
| % Dot Gain | 12 | 18 | 18 | 21 |
| Top Density | 1.41 | 1.45 | 1.48 | 1.49 |

TABLE 17

| | SAMPLE No. | | | |
|---|---|---|---|---|
| | 1 | 2 | 3 | 4 |
| UV Exposure Energy ($mj/cm^2$) | 7.5 | 10.3 | 13.9 | 21 |
| Visible energy ($mj/cm^2$) | 37 | 37 | 37 | 37 |
| # Untoned Stouffer Steps | 1 | 1.5 | 3 | 2.5 |
| % Dot Range | 2–97 | 2–97 | 2–98 | 2–98 |
| % Dot Gain | 21 | 16 | 13 | 12 |
| Top Density | 1.53 | 1.48 | 1.47 | 1.49 |

Excellent quality positive and negatives were achieved with the imaging composition containing ETQC as the sole visible photosensitizer.

I claim:

1. A process for producing a negative image from a photohardenable electrostatic master comprising (A) imagewise exposing to visible radiation a photohardenable electrostatic master comprising (1) an electrically conductive substrate bearing (2) a photohardenable layer comprising (a) a polymeric binder, (b) a compound having at least one ethylenically unsaturated group, (c) a photoinitiator, (d) a photoinhibitor, and (e) at least one visible light sensitizer;

(B) charging electrostatically the photohardenable electrostatic master to form a latent image of electrostatic charge on the imagewise exposed areas;

(C) developing the charged latent image by applying an electrostatic toner of opposite charge; and (D) transferring the toned image to a receptor surface.

2. A process according to claim 1 wherein the photohardenable electrostatic master is electrostatically charged by corona discharge.

3. A process according to claim 1 wherein the electrostatic toner of opposite charge is a dry electrostatic toner.

4. A process according to claim 1 wherein the electrostatic toner of opposite charge is present in a liquid electrostatic developer.

5. A process according to claim 4 wherein the liquid electrostatic developer comprises a nonpolar liquid having a Kauri-butanol value of less than 30, a thermoplastic resin having an average particle size of less than 10 μm, and a nonpolar liquid soluble ionic or zwitterionic compound.

6. A process according to claim 5 wherein the liquid electrostatic developer contains a colorant.

7. A process according to claim 1 wherein the receptor surface to which the toned image is transferred to paper.

8. A process according to claim 1 wherein steps (A) to (C) are repeated at least one time, and the toned image is transferred to a different receptor surface.

9. A process according to claim 1 wherein steps (A) to (D) are repeated at least one time and the toned imaged is transferred in register to the toned image on the receptor surface.

10. A process according to claim 1 wherein steps (A) to (D) are repeated four times, the imagewise exposure (A) being to different photohardenable electrostatic masters through different separation transparencies corresponding to yellow, cyan, magenta and black; the developing (C) being by means of an electrostatic toner of a color corresponding to that of the transparency, and the transferring (D) of the toned image being in register to the initial toner image on the receptor surface.

11. A process according to claim 10 wherein the receptor surface is paper.

12. A process for producing a positive image from a photohardenable electrostatic master comprising (A) imagewise exposing to ultraviolet radiation a photohardenable electrostatic master comprising (1) an electrically conductive substrate bearing (2) a photohardenable layer comprising
(a) a polymeric binder,
(b) a compound having at least one ethylenically unsaturated group,
(c) a photoinitiator,
(d) a photoinhibitor, and
(e) at least one visible light sensitizer;

(B) exposing overall the photohardenable electrostatic master to visible radiation:

(C) charging electrostatically the photohardenable electrostatic master to form a latent image of electrostatic charge on the imagewise exposed areas;

(D) developing the charged latent image by applying an electrostatic toner of opposite charge; and (E) transferring the toned image to a receptor surface.

13. A process according to claim 12 wherein the photohardenable electrostatic master is electrostatically charged by corona discharge.

14. A process according to claim 12 wherein the electrostatic toner of opposite charge is a dry electrostatic toner.

15. A process according to claim 12 wherein the electrostatic toner of opposite charge is present in a liquid electrostatic developer.

16. A process according to claim 15 wherein the liquid electrostatic developer comprises a nonpolar liquid having a Kauri-butanol value of less than 30, a thermoplastic resin having an average particle size of less than 10 $\mu m$, and a nonpolar liquid soluble ionic or zwitterionic compound.

17. A process according to claim 16 wherein the liquid electrostatic developer contains a colorant.

18. A process according to claim 12 wherein the receptor surface to which the toned image is transferred to paper.

19. A process according to claim 12 wherein steps (A) to (D) are repeated at least one time, and the toned image is transferred to a different receptor support.

20. A process according to claim 12 wherein steps (A) to (E) are repeated at least one time, and the toned imaged is transferred in register to the toner image on the receptor surface.

21. A process according to claim 12 wherein steps (A) to (E) are repeated four times, the imagewise exposure (A) being through different separation transparencies corresponding to yellow, cyan, magenta and black; the developing (D) being by means of an electrostatic toner of a color corresponding to that of the transparency, and the transferring (E) of the toner image being in register to the initial toner image on the receptor surface.

22. A process according to claim 21 wherein the receptor surface is paper.

23. A process according to claim 1 wherein compound (d) is a nitroaromatic compound of the formula

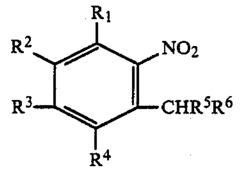

wherein $R^1$, $R^2$, $R^3$ and $R^4$, alike or different H, OH, halogen, $NO_2$, CN, alkyl of 1 to 18 carbons, alkoxy in which the alkyl is of 1 to 18 carbons, acyloxy of 2 to 7 carbons, aryl of 6 to 18 carbons, benzyl, halogen-substituted phenyl, polyether of 2 to 18 carbons and 2 to 10 oxygens, dialkylamino in which each alkyl is of 1 to 18 carbons, thioalkyl in which the alkyl is of 1 to 18 carbons, or thioaryl in which the aryl is of 6 to 18 carbons, $R^2$ and $R^3$, taken together are $-OCH_2O-$ or $-O-(CH_2CH_2O)_q-$ in which q is an integer from 1 to 5, or any two of $R^1$, $R^2$, $R^3$ and $R^4$, taken together are the residue of a second benzene ring fused into the benzene nucleus, with the proviso that not more than one of $R^1$, $R^2$, $R^3$ and $R^4$ is OH or $NO_2$, $R^5$ is H, alkyl of 1 to 18 carbons, halogen, phenyl, or alkoxy in which the alkyl is of 1 to 18 carbons, $R^6$ is H, OH, alkyl of 1 to 18 carbons, phenyl, alkoxy in which the alkyl is of 1 to 18 carbons, or aryloxy of 6 to 18 carbons unsubstituted or substituted with halogen, alkyl of 1 to 6 carbons, or alkoxy of 1 to 6 carbons, with the proviso that only one of $R^5$ and $R^6$ is H, or $R^5$ and $R^6$ together are $=O$, $=CH_2$, $-O-CH_2-$, $=NC_6H_5$, $=NC_6H_4N(alkyl)_2$ in which each alkyl is of 1 to 18 carbons, $-O-C_2H_4-O-$, $=N(alkyl)$ in which the alkyl is of 1 to 6 carbons,

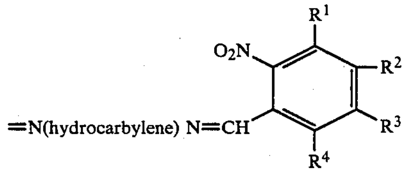

in which the hydrocarbylene group is of 1 to 18 carbons, or

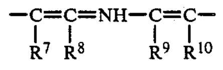

in which $R^8$ and $R^9$, alike or different, are H or alkyl of 1 to 4 carbons, and $R^7$ and $R^{10}$, alike or different, are —CN, —$COR^{11}$ in which $R^{11}$ is alkyl of 1 to 5 carbons, or —$COOR^{12}$ in which $R^{12}$ is alkyl of 1 to 6 carbons which may be interrupted by an oxygen atom, alkenyl of 2 to 5 carbons, or alkynyl of 2 to 5 carbons, or $R^7$ and $R^8$ together, or $R^9$ and $R^{10}$ together, complete a 6-membered carbocyclic ring containing a keto group.

24. A process according to claim 12 wherein compound (d) is a nitroaromatic compound of the formula

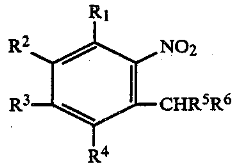

wherein $R^1$, $R^2$, $R^3$ and $R^4$, alike or different are H, OH, halogen, $NO_2$, CN, alkyl of 1 to 18 carbons, alkoxy in which the alkyl is of 1 to 18 carbons, acyloxy of 2 to 7 carbons, aryl of 6 to 18 carbons, benzyl, halogen-substituted phenyl, polyether of 2 to 18 carbons and 2 to 10 oxygens, dialkylamino in which each alkyl is of 1 to 18 carbons, thioalkyl in which the alkyl is of 1 to 18 carbons, or thioaryl in which the aryl is of 6 to 18 carbons, $R^2$ and $R^3$, taken together are —$OCH_2O$— or —$O{+}CH_2CH_2O{+}_q$ in which q is an integer from 1 to 5, or any two of $R^1$, $R^2$, $R^3$ and $R^4$, taken together are the residue of a second benzene ring fused into the benzene nucleus, with the proviso that not more than one of $R^1$, $R^2$, $R^3$ and $R^4$ is OH or $NO_2$, $R^5$ is H, alkyl of 1 to 18 carbons, halogen, phenyl, or alkoxy in which the alkyl is of 1 to 18 carbons, $R^6$ is H, OH, alkyl of 1 to 18 carbons, phenyl, alkoxy in which the alkyl is of 1 to 18 carbons, or aryloxy of 6 to 18 carbons unsubstituted or substituted with halogen, alkyl of 1 to 6 carbons, or alkoxy of 1 to 6 carbons, with the proviso that only one of $R^5$ and $R^6$ is H, or $R^5$ and $R^6$ together are =O, =$CH_2$, —O—$CH_2$—, =$NC_6H_5$, =$NC_6H_4N(alkyl)_2$ in which each alkyl is of 1 to 18 carbons, —O—$C_2H_4$—O—, =N(alkyl) in which the alkyl is of 1 to 6 carbons,

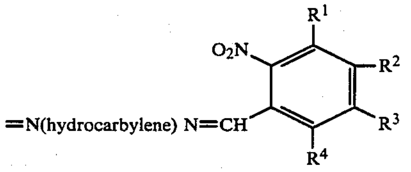

in which the hydrocarbylene group is of 1 to 18 carbons, or

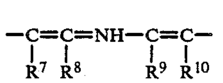

in which $R^8$ and $R^9$, alike or different, are H or alkyl of 1 to 4 carbons, and $R^7$ and $R^{10}$, alike or different, are —CN, —$COR^{11}$ in which $R^{11}$ is alkyl of 1 to 5 carbons, or —$COOR^{12}$ in which $R^{12}$ is alkyl of 1 to 6 carbons which may be interrupted by an oxygen atom, alkenyl of 2 to 5 carbons, or alkynyl of 2 to 5 carbons, or $R^7$ and $R^8$ together, or $R^9$ and $R^{10}$ together, complete a 6-membered carbocyclic ring containing a keto group.

25. A process according to claim 23 wherein compound (e) is an arylylidene aryl ketone compound of the formulae:

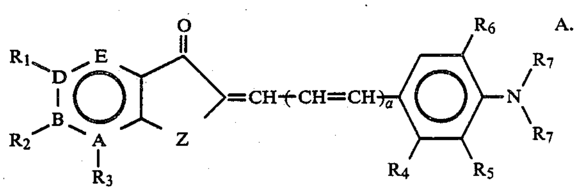

A.

wherein

A, B, D, E are carbon atoms or one may be solely a nitrogen atom;

$R_1$ is H, OH or $CH_3O$;

$R_2$ is H, OH, $CH_3O$ or $N(R_7)_2$;

$R_3$ is H, OH or $CH_3O$;

a is 0 or 1;

Z is >C=O, >CHOH, >$C(CH_3)_2$, $+CH_2+_b$, wherein b is 1, 2 or 3,

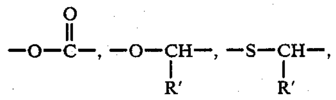

wherein

R' is H, phenyl, or Z is linked with $R_4$ where Z is

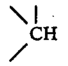

and $R_4$ is —O— or >N—$CH_3$, a being 0;

$R_4$ is H, $CH_3$, OH, $CH_3O$;

$R_5$ is H or $R_5+R_7$ is —$CH_2CH_2$—, —$CH_2CH_2CH_2$—, —O—$CH_2CH_2$—;

$R_6$ is H or $R_6+R_7$ is —$CH_2CH_2$—, —$CH_2CH_2CH_2$—, O—$CH_2CH_2$—; and $R_7$ is $CH_3$, —$(CH_2)_n$—$CH_3$ where n is 1 to 5, —$CH_2CH_2$—Cl, —$CH_2CH_2OH$, $CH_2CH_2OCH_3$;

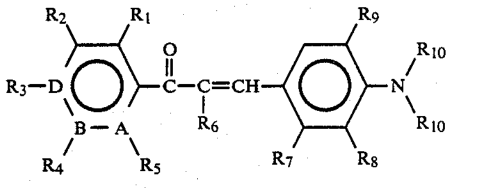

B.

wherein:

A, B, D are carbon atoms or one may be solely a nitrogen atom;

$R_1$ is H, $CH_3$, —$OCH_2CH_2OR$, wherein R is H, $CH_3$, —$CH_2CH_2OR'$ wherein R' is $CH_3$ or $CH_3CH_2$—;

$R_2$ is H, $CH_3$, OH, or $CH_3O$;

$R_3$ is H, OH, $CH_3O$, Ch3, F, Br, CN or N $(R_{10})_2$;

$R_2+R_3$ is —O—$CH_2$—O—;

$R_4$ is H, $CH_3$ or $CH_3O$;

$R_5$ is H, $CH_3$, —$OCH_2CH_2OR$, wherein R is H, $CH_3$, —$CH_2CH_2OR'$ wherein R' is $CH_3$ or $CH_3CH_2$—;

$R_6$ is H, $CH_3$ or phenyl;
$R_7$ is H, $CH_3$, OH or $CH_3O$;
$R_8$ is H;
$R_8+R_{10}$ is $-CH_2CH_2-$, $-CH_2CH_2CH_2-$, $-OCH_2CH_2-$;
$R_9$ is H, $R_9+R_{10}$ is $-CH_2CH_2-$, $-CH_2CH_2CH_2-$, $-OCH_2CH-_2$; and
$R_{10}$ is $CH_3$, $-CH_2-_nCH_3$ wherein n is 1 to 5; and

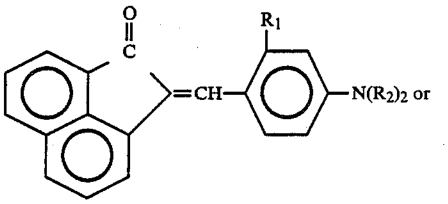

C.

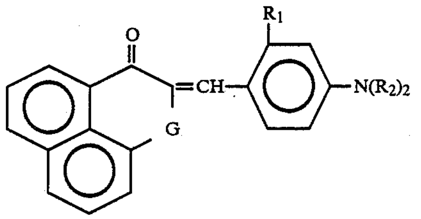

wherein
G is

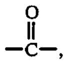

—O—, or —S—;
$R_1$ is H, $CH_3$ or $-OCH_3$, and
$R_2$ is $CH_3$ or $-CH_2CH_3$,
the ketone having its maximum absorption in the range of 350 to 550 nm.

26. A process according to claim 24 wherein compound (e) is an arylylidene aryl ketone compound of the formulae:

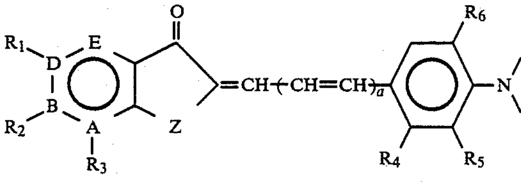

A.

wherein:
A, B, D, E are carbon atoms or one may be solely a nitrogen atom;
$R_1$ is H, OH or $CH_3O$;
$R_2$ is H, OH, $CH_3O$ or $N(R_7)_2$;
$R_3$ is H, OH or $CH_3O$;
a is 0 or 1;
Z is $>C=O$, $>CHOH$, $>C(CH_3)_2$, $-CH_2-_b$, wherein b is 1, 2 or 3,

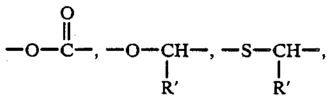

wherein
R' is H, phenyl, or Z is linked with $R_4$ where Z is

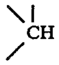

and $R_4$ is —O— or $>N-CH_3$, a being 0;
$R_4$ is H, $CH_3$, OH, $CH_3O$;
$R_5$ is H or $R_5+R_7$ is $-CH_2CH_2-$, $-CH_2CH_2CH_2-$, $-O-CH_2CH_2-$;
$R_6$ is H or $R_6+R_7$ is $-CH_2CH_2-$, $-CH_2CH_2CH_2-$, $O-CH_2CH_2-$; and
$R_7$ is $CH_3$, $-(CH_2)_n-CH_3$ where n is 1 to 5, $-CH_2CH_2-Cl$, $-CH_2CH_2OH$, $CH_2CH_2OCH_3$;

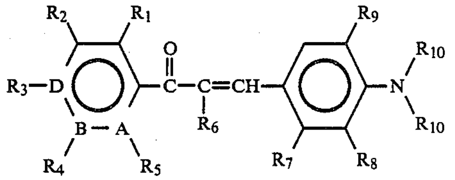

wherein:
A, B, D are carbon atoms or one may be solely a nitrogen atom;
$R_1$ is H, $CH_3$, $-OCH_2CH_2OR$, wherein R is H, $CH_3$, $-CH_2CH_2OR'$ wherein R' is $CH_3$ or $CH_3CH_2-$;
$R_2$ is H, $CH_3$, OH, or $CH_3O$;
$R_3$ is H, OH, $CH_3O$, $CH_3$, F, Br, CN or $N(R_{10})_2$;
$R_2+R_3$ is $-O-CH_2-O-$;
$R_4$ is H, $CH_3$ or $CH_3O$;
$R_5$ is H, $CH_3$, $-OCH_2CH_2OR$, wherein R is H, $CH_3$, $-CH_2CH_2OR'$ wherein R' is $CH_3$ or $CH_3CH_2-$;
$R_6$ is H , $CH_3$ or phenyl;
$R_7$ is H, $CH_3$, OH or $CH_3O$;
$R_8$ is H;
$R_8+R_{10}$ is $-CH_2CH_2-$, $-CH_2CH_2CH_2-$, $-OCH_2CH_2-$;
$R_9$ is H, $R_9+R_{10}$ is $-CH_2CH_2-$, $-CH_2CH_2CH_2-$, $-OCH_2CH_2-$; and
$R_{10}$ is $CH_3$, $-CH_2-_nCH_3$ wherein n is 1 to 5; and

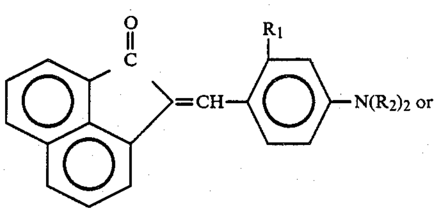

C.

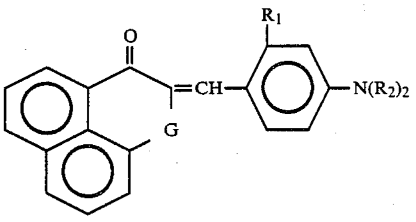

wherein
G is

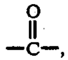,

—O—, or —S—;

$R_1$ is H, $CH_3$ or $—OCH_3$, and $R_2$ is $CH_3$ or $—CH_2CH_3$, the ketone having its maximum absorption in the range of 350 to 550 nm.

27. A process according to claim 23 wherein compound (d) is 1-(2'-nitro-4',5'-dimethoxy)phenyl-1-(4-t-butyl phenoxy)ethane.

28. A process according to claim 24 wherein compound (d) is 1-(2'-nitro-4',5'-dimethoxy)phenyl-1-(4-t-butyl phenoxy)ethane.

29. A process according to claim 25 wherein compound (e) is 2-(N-ethyl-1,2,3,4-tetrahydro-6-quinolylidene)-1-chromanone.

30. A process according to claim 26 wherein compound (e) is 2-(N-ethyl-1,2,3,4-tetrahydro-6-quinolylidene)-1-chromanone.

31. A process according to claim 25 wherein the photohardenable electrostatic master comprises an aluminized polyethylene terephthalate support bearing a photohardenable layer wherein binder (a) is poly(-styrene/methylmethacrylate), compound (b) is ethoxylated trimethylol propane triacrylate, photoinitiator (c) is the combination of 2,2'-bis(o-chlorophenyl)-4,4',5,5'-tetraphenylbiimidazole and 2,2'-bis(o-chlorophenyl)-4,4',5,5'-tetrakis(m-methoxyphenyl)-biimidazole, photoinhibitor (d) is 1,(2'-nitro-4',5'-dimethoxy)phenyl-1-(4-t-butyl phenoxy)ethane and visible light sensitizer (e) is 2-(N-ethyl-1,2,3,4-tetrahydro-6-quinolylidene)-1-chromanone.

32. A process according to claim 26 wherein the photohardenable electrostatic master comprises an aluminized polyethylene terephthalate support bearing a photohardenable layer wherein binder (a) is poly(-styrene/methylmethacrylate), compound (b) is ethoxylated trimethylol propane triacrylate, photoinitiator (c) is the combination of 2,2'-bis(o-chlorophenyl)-4,4',5,5'-tetraphenylbiimidazole and 2,2'-bis(o-chlorophenyl)-4,4',5,5'-tetrakis(m-methoxyphenyl)-biimidazole, photoinhibitor (d) is 1,(2'-nitro-4',5'-dimethoxy)phenyl-1-(4-t-butyl phenoxy)ethane and visible light sensitizer (e) is 2-(N-ethyl-1,2,3,4-tetrahydro-6-quinolylidene)-1-chromanone.

33. A process according to claim 25 wherein the photohardenable electrostatic master comprises an aluminized polyethylene terephthalate support bearing a photohardenable layer wherein binder (a) is poly(-styrene/methylmethacrylate), compound (b) is ethoxylated trimethylol propane triacrylate, photoinitiator (c) is 2,2'-bis(o-chlorophenyl)-4,4',5,5'-tetraphenylbiimidazole, photoinhibitor (d) is 1,(2'-nitro-4',5'-dimethoxy)phenyl-1-(4-t-butyl phenoxy)ethane and visible light sensitizer (e) is 2-(N-ethyl-1,2,3,4-tetrahydro-6-quinolylidene)-1-chromanone.

34. A process according to claim 26 wherein the photohardenable electrostatic master comprises an aluminized polyethylene terephthalate support bearing a photohardenable layer wherein binder (a) is poly(-styrene/methylmethacrylate), compound (b) is ethoxylated trimethylol propane triacrylate, photoinitiator (c) is 2,2'-bis(o-chlorophenyl)-4,4',5,5'-tetraphenylbiimidazole, photoinhibitor (d) is 1,(2'-nitro-4',5'-dimethoxy)phenyl-1-(4-t-butyl phenoxy)ethane and visible light sensitizer (e) is 2-(N-ethyl-1,2,3,4-tetrahydro-6-quinolylidene)-1-chromanone.

35. A process according to claim 1 wherein a protective release layer is present on the photohardenable layer which is removed after step (A).

36. A process according to claim 35 wherein the release layer is polyethylene or polypropylene.

37. A process according to claim 12 wherein a protective release layer is present on the photohardenable layer which is removed after step (A).

38. A process according to claim 37 wherein the release layer is polyethylene or polypropylene.

39. A process according to claim 25 wherein photoinitiator (c) is a hexaarylbiimidazole compound.

40. A process according to claim 26 wherein photoinitiator (c) is a hexaarylbiimidazole compound.

41. A process according to claim 39 wherein (f) a chain transfer agent is present.

42. A process according to claim 40 wherein (f) a chain transfer agent is present.

43. A process according to claim 41 wherein the chain transfer agent is 2-mercaptobenzoxazole.

44. A process according to claim 42 wherein the chain transfer agent is 2-mercaptobenzoxazole.

45. A process according to claim 41 wherein the chain transfer agent is 2-mercaptobenzothiazole.

46. A process according to claim 42 wherein the chain transfer agent is 2-mercaptobenzothiazole.

47. A process according to claim 1 wherein the binder is poly(methylmethacrylate).

48. A process according to claim 12 wherein the binder is poly(methylmethacrylate).

49. A process according to claim 1 wherein the electrically conductive substrate is aluminized polyethylene terephthalate.

50. A process according to claim 12 wherein the electrically conductive substrate is aluminized polyethylene terephthalate.

* * * * *